United States Patent
Lear et al.

(10) Patent No.: US 12,334,413 B2
(45) Date of Patent: Jun. 17, 2025

(54) SYSTEM IN PACKAGE WITH FLIP CHIP DIE OVER MULTI-LAYER HEATSINK STANCHION

(71) Applicant: Qorvo US, Inc., Greensboro, NC (US)

(72) Inventors: Kelly M. Lear, Longwood, FL (US); Jeffrey Miller, Allen, TX (US); Mihir Roy, Sachse, TX (US); Christine Blair, Lewisville, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/432,852

(22) Filed: Feb. 5, 2024

(65) Prior Publication Data

US 2024/0178096 A1 May 30, 2024

Related U.S. Application Data

(63) Continuation of application No. 17/538,583, filed on Nov. 30, 2021, now Pat. No. 11,942,391.

(51) Int. Cl.
| | |
|---|---|
| *H01L 23/367* | (2006.01) |
| *H01L 23/48* | (2006.01) |
| *H01L 23/492* | (2006.01) |

(52) U.S. Cl.
CPC ........ *H01L 23/3677* (2013.01); *H01L 23/481* (2013.01); *H01L 23/4924* (2013.01)

(58) Field of Classification Search
CPC .......................... H01L 23/3677; H01L 23/481; H01L 23/4924
See application file for complete search history.

(56) References Cited

U.S. PATENT DOCUMENTS

| | | |
|---|---|---|
| 10,085,352 B2 | 9/2018 | Costa |
| 10,587,029 B2 | 3/2020 | Dekosky et al. |
| 10,796,835 B2 | 10/2020 | Zybura et al. |

(Continued)

FOREIGN PATENT DOCUMENTS

| | | |
|---|---|---|
| EP | 3647800 A1 | 5/2020 |

OTHER PUBLICATIONS

Non-Final Office Action for U.S. Appl. No. 17/538,583, mailed Jun. 23, 2023, 11 pages.

(Continued)

*Primary Examiner* — Peniel M Gumedzoe
(74) *Attorney, Agent, or Firm* — Withrow & Terranova, P.L.L.C.

(57) ABSTRACT

The present disclosure relates to a system in package having a chiplet with a first substrate and a first die deposed over the first substrate, a second die, a second substrate that the chiplet and the second die are deposed over, and a heatsink spreader deposed over the chiplet and the second die. Herein, the first substrate includes layered-cake shaped heatsink stanchions that are coupled to the first die, and the second substrate includes layered-cake shaped heatsink stanchions that are coupled to the chiplet and the second die. As such, heat generated by the first die can be dissipated by the heatsink stanchions within the first and second substrates, and heat generated by the second die can be dissipated by the heatsink stanchions within the second substrate. Furthermore, the heat generated by the first die and the second die can be dissipated by the heatsink spreader above them.

24 Claims, 20 Drawing Sheets

(56) References Cited

U.S. PATENT DOCUMENTS

| | | |
|---|---|---|
| 11,942,391 B2 | 3/2024 | Lear et al. |
| 2012/0049345 A1 | 3/2012 | Railkar et al. |
| 2012/0104574 A1 | 5/2012 | Boeck et al. |
| 2012/0261166 A1* | 10/2012 | Oh .................... H05K 3/181 |
| | | 174/266 |
| 2013/0319737 A1* | 12/2013 | Hurwitz ............ H01L 23/3677 |
| | | 174/262 |
| 2013/0319739 A1 | 12/2013 | Arnold |
| 2016/0240488 A1 | 8/2016 | Viswanathan et al. |
| 2017/0018478 A1 | 1/2017 | Maple et al. |
| 2017/0025325 A1* | 1/2017 | Thong ................ H01L 23/3675 |
| 2017/0033031 A1 | 2/2017 | Dungan |
| 2017/0084379 A1 | 3/2017 | Leipold et al. |
| 2017/0194300 A1 | 7/2017 | Lin et al. |
| 2020/0035550 A1 | 1/2020 | Emerson et al. |

OTHER PUBLICATIONS

Final Office Action for U.S. Appl. No. 17/538,583, mailed Nov. 3, 2023, 14 pages.
Notice of Allowance for U.S. Appl. No. 17/538,583, mailed Dec. 8, 2023, 8 pages.
Extended European Search Report for European Patent Application No. 22207023.7, mailed Apr. 26, 2023, 7 pages.

* cited by examiner

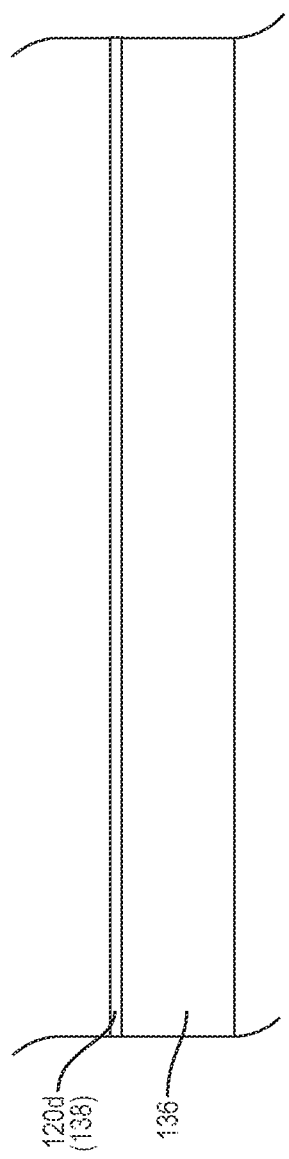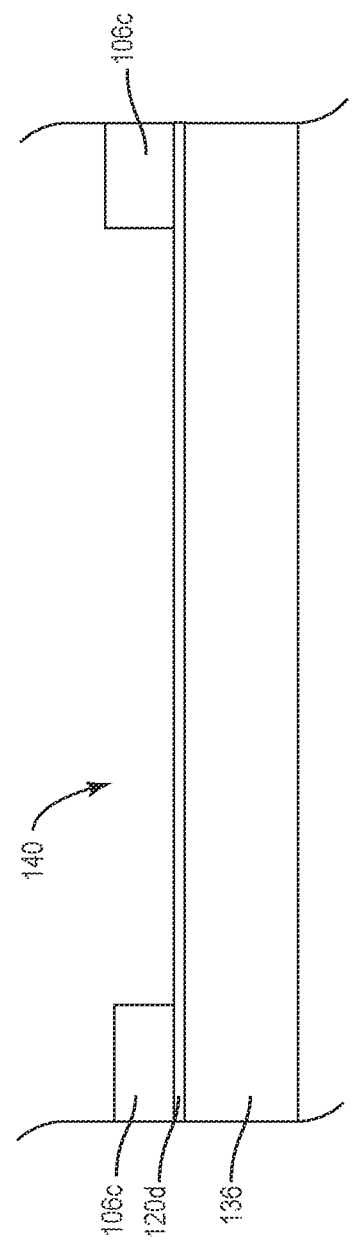

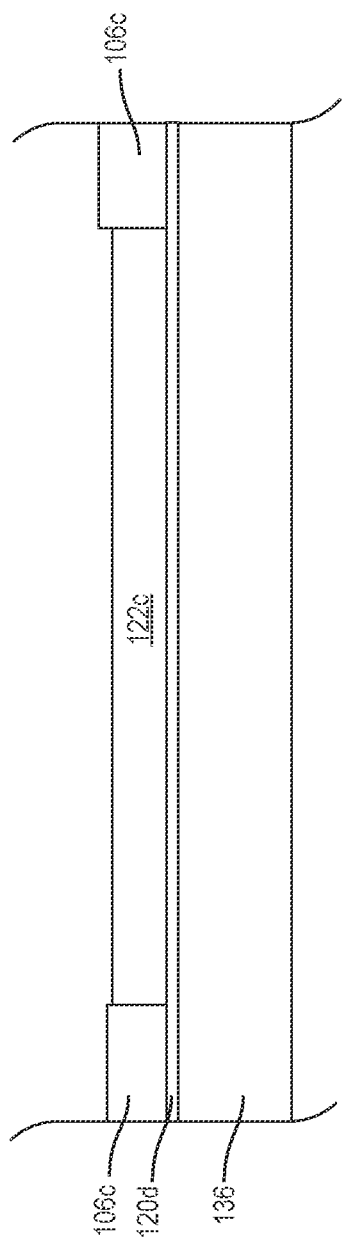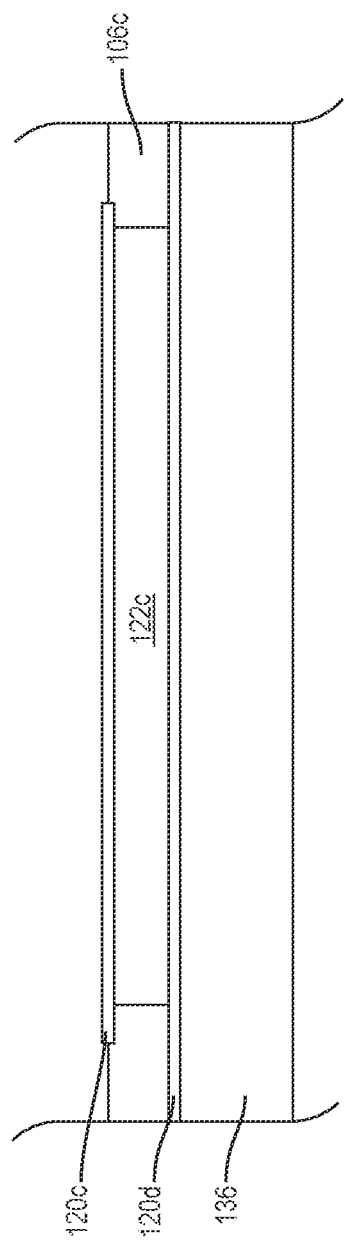

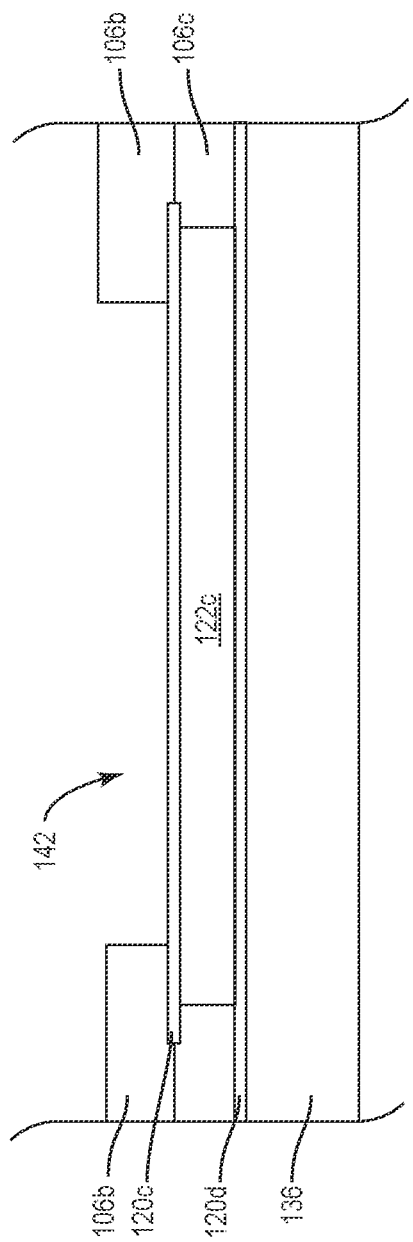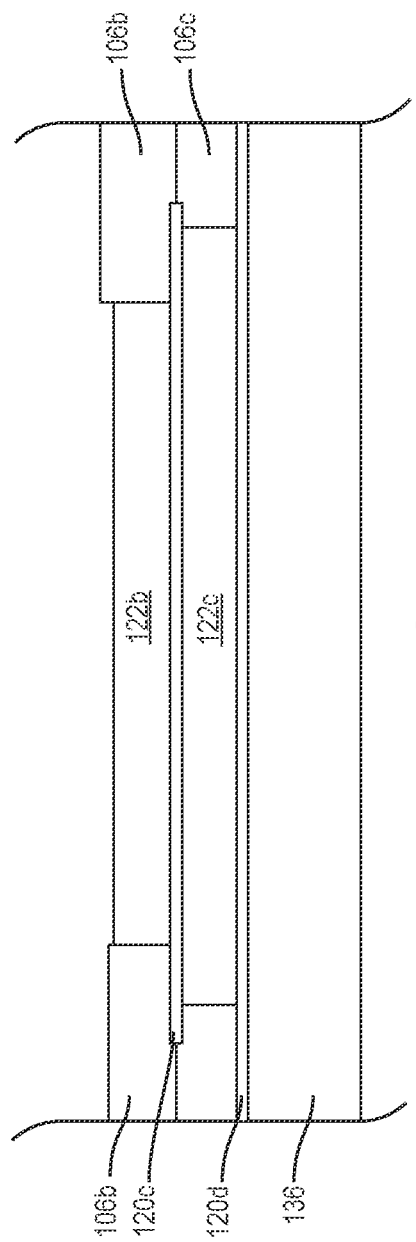

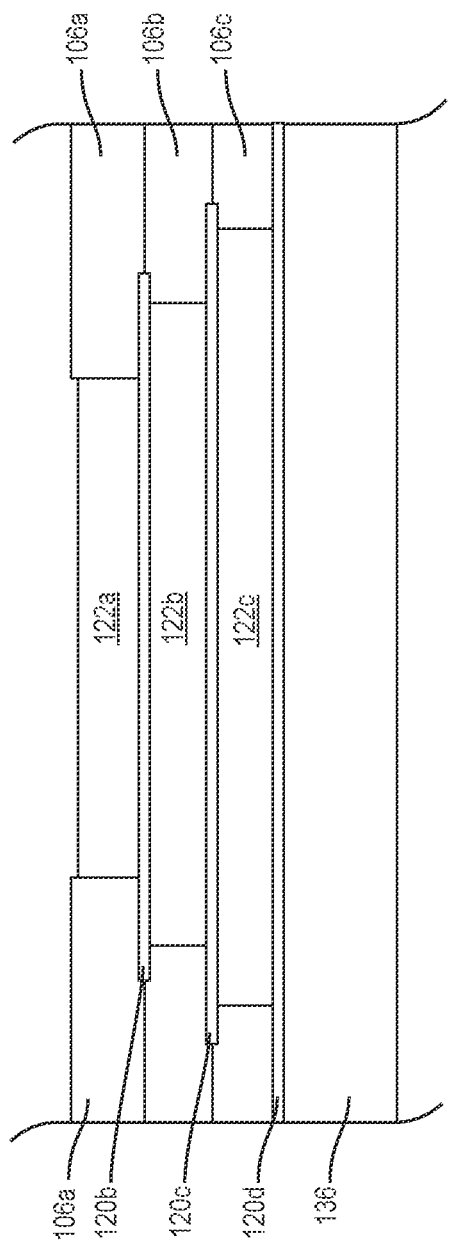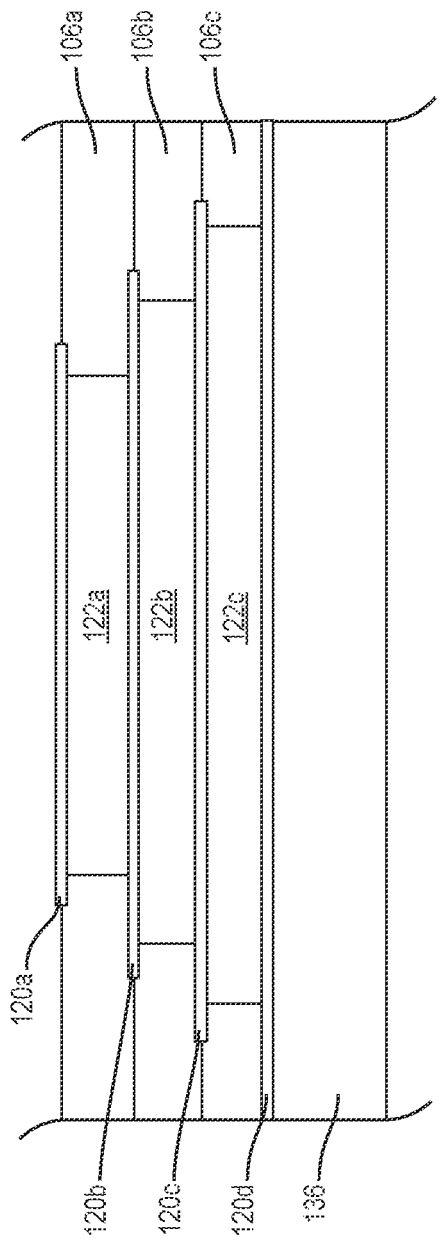

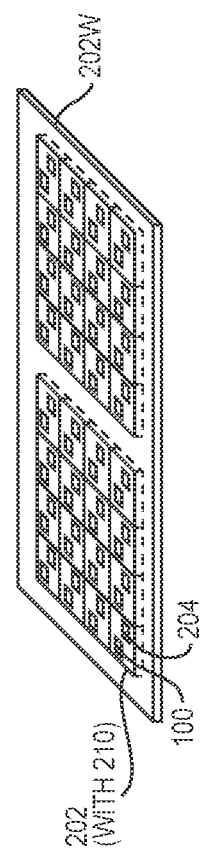
FIG. 5A
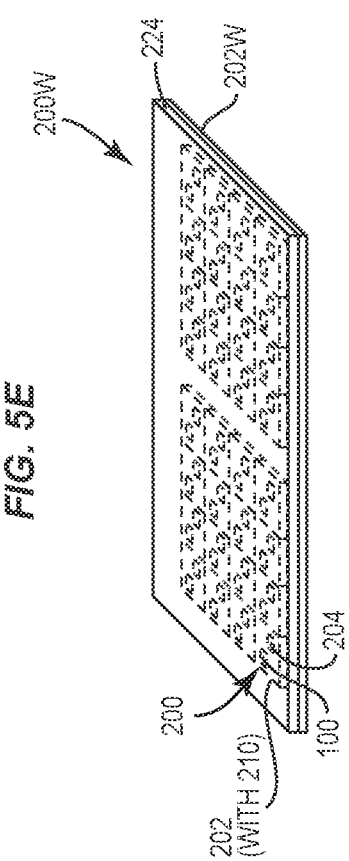
FIG. 5B
FIG. 5C
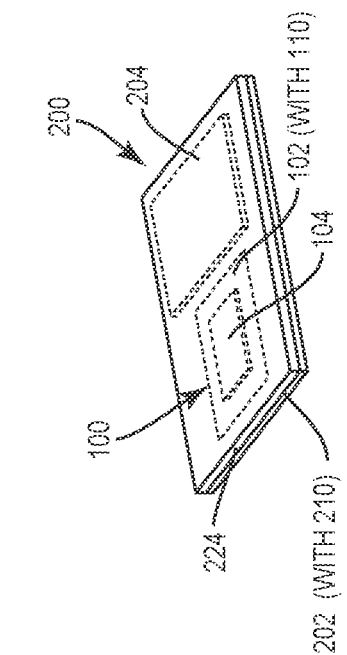
FIG. 5D
FIG. 5E
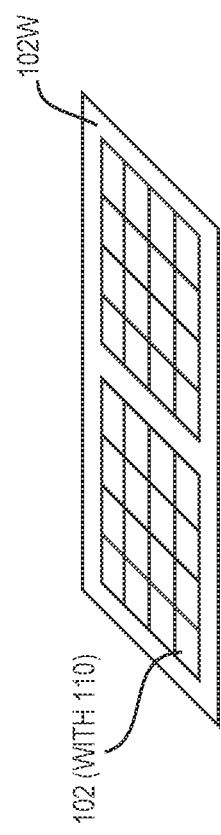
FIG. 5F
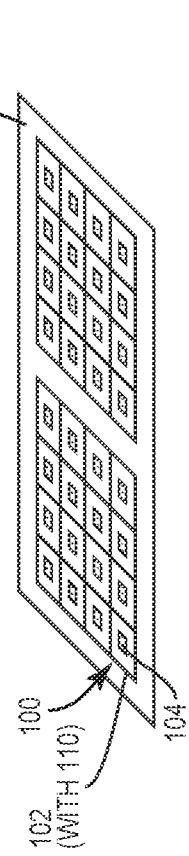
FIG. 5G

SYSTEM IN PACKAGE WITH FLIP CHIP DIE OVER MULTI-LAYER HEATSINK STANCHION

RELATED APPLICATIONS

This application is a continuation of U.S. patent application Ser. No. 17/538,583, filed Nov. 30, 2021, now U.S. Pat. No. 11,942,391, the disclosure of which is hereby incorporated herein by reference in its entirety.

FIELD OF THE DISCLOSURE

The present disclosure relates to a system in package (SIP) having one or more dies, and more particularly having one or more flip-chip dies, over one or more multi-layer heatsink stanchions and a process for making the same.

BACKGROUND

High power performance and high computing performance in micro-scale applications, such as radio frequency (RF) semiconductor devices, poses many challenges in meeting ever demanding requirements. As power demands increase, the complexity in managing thermal waste generated by the RF semiconductor devices has increased significantly. If the heat generated by the RF semiconductor devices cannot be dissipated efficiently, the RF semiconductor devices may fail to operate or have a degraded operating performance.

Typically, the RF semiconductor devices reside on a substrate within a package, and the substrate will affect the RF semiconductor devices performance in many ways. For instance, the heat produced by the RF semiconductor devices could be conducted away from their immediate vicinity through the substrate. Laminate materials are widely used in substrates, which are inexpensive and have a mature supply-base within the industry. However, the laminate materials have poor thermal properties.

Accordingly, in order to accommodate the increased heat generation of the high-performance devices, and to utilize the inexpensive and mature supply-base laminate substrates, there remains a need for improved package designs for housing the high-performance devices. The disclosed package designs will be easily fabricated and low cost, and provide efficient dissipation of thermals, such that the devices enclosed in the packages can operate at optimal performance.

SUMMARY

The present disclosure describes a system in package (SIP) having one or more dies over multi-layer heatsink stanchion(s) and a process for making the same. The disclosed SIP includes a chiplet that has a substrate and a first die. Herein, the substrate includes a number of dielectric layers and at least one heatsink stanchion extending through the dielectric layers. The at least one heatsink stanchion includes a number of heatsink metal plates and a number of heatsink metal bars, which is alternated with the heatsink metal plates. The heatsink metal bars are configured in a layered-cake shape. The first die is deposed over the substrate and connected to the at least one heatsink stanchion, such that heat generated by the first die can be dissipated by the at least one heatsink stanchion within the substrate.

In one embodiment of the SIP, each heatsink metal bar has a shape of a cube, a cylinder, a triangular prism, or a trapezoidal prism.

In one embodiment of the SIP, at least one of the heatsink metal bars are capable to be sized as large as about 95% of a horizontal area of the chiplet In one embodiment of the SIP, the first die is a flip-chip die, which includes a die body and a number of interconnects configured to connect the die body and the substrate. Herein, at least one of the interconnects is configured to connect the die body and the at least one heatsink stanchion within the substrate.

In one embodiment of the SIP, the die body includes one or more materials of silicon (Si), Gallium Arsenide (GaAs), GaAs on Si, Gallium Nitride (GaN), GaN on Si, GaN on Silicon Carbide (SiC), and piezoelectric materials. The interconnects are solder bumps or copper (Cu) pillars.

In one embodiment of the SIP, the dielectric layers include at least a top dielectric layer and a bottom dielectric layer underneath the top dielectric layer. The heatsink metal plates include at least a top heatsink metal plate and a bottom heatsink metal plate, and the heatsink metal bars include at least a top heatsink metal bar underneath the top heatsink metal plate and a bottom heatsink metal bar underneath the top heatsink metal bar. The at least one interconnect is connected to the at least one heatsink stanchion by directly contacting the top heatsink metal plate.

In one embodiment of the SIP, the top heatsink metal plate is formed at a top of the top dielectric layer, and the top heatsink metal bar is connected to the top heatsink metal plate and extends through the top dielectric layer. The bottom heatsink metal plate is formed at a bottom of the bottom dielectric layer, and the bottom heatsink metal bar is connected to the bottom heatsink metal plate and extends through the bottom dielectric layer.

In one embodiment of the SIP, the heatsink metal plates further include a middle heatsink metal plate, which is formed at a top of the top dielectric layer. The top heatsink metal bar protrudes vertically beyond the top of the top dielectric layer and connects the middle heatsink metal plate and the top heatsink metal plate. The bottom heatsink metal plate is formed at a bottom of the bottom dielectric layer, and the bottom heatsink metal bar is connected to the bottom heatsink metal plate and extends through the bottom dielectric layer.

In one embodiment of the SIP, the top heatsink metal plate is formed at a top of the top dielectric layer, and the top heatsink metal bar is connected to the top heatsink metal plate and extends through the top dielectric layer. The bottom heatsink metal plate is formed at a bottom of the bottom dielectric layer, and the bottom heatsink metal bar is connected to the bottom heatsink metal plate and protrudes vertically beyond the bottom of the bottom dielectric layer.

In one embodiment of the SIP, the chiplet further includes an enclosure residing over the substrate to at least partially encapsulate the first die.

In one embodiment of the SIP, the enclosure is a mold compound.

In one embodiment of the SIP, the enclosure includes a cap and an outer wall that extends from the cap toward a top surface of the substrate to form an air cavity. The first die resides within the air cavity.

In one embodiment of the SIP, the substrate further includes at least one via structure that is electrically connected to the first die. Herein, the at least one via structure includes a number of via metal plates and a number of via metal bars, which is alternated with the via metal plates. At least one of the heatsink metal bars in the at least one heatsink stanchion is more than ten times larger than one of the via metal bars in the at least one via structure in a horizontal plane.

In one embodiment of the SIP, the at least one via structure includes one of the via metal bars, which is located beyond horizontal dimensions of the first die and protrudes vertically above the dielectric layers to form a grounded metal wall.

In one embodiment of the SIP, the substrate further includes an opening straddled by the first die. The at least one heatsink stanchion includes a first heatsink stanchion and a second heatsink stanchion, each of which extends vertically through the plurality of dielectric layers. The opening extends vertically through the dielectric layers and separates the first heatsink stanchion and the second heatsink stanchion.

In one embodiment of the SIP, the substrate further comprises an antenna structure residing in the dielectric layers of the substrate. Herein, the antenna structure is laterally offset from the first die and connected to the at least one heatsink stanchion, such that heat generated by the antenna structure can be dissipated by the at least one heatsink stanchion within the substrate.

According to one embodiment, the SIP further includes a second substrate. Herein, the second substrate includes a number of dielectric layers and at least one heatsink stanchion extending through these dielectric layers. The at least one heatsink stanchion of the second substrate includes a number of heatsink metal plates and a number of heatsink metal bars, which is alternated with these heatsink metal plates. The heatsink metal bars of the second substrate are configured in a layered-cake shape. The chiplet is deposed over the second substrate, where the at least one heatsink stanchion of the substrate is connected to the at least one heatsink stanchion of the second substrate by at least one package interconnect. As such, the heat generated by the first die can be propagated through the at least one heatsink stanchion of the substrate and the at least one heatsink stanchion of the second substrate.

In one embodiment of the SIP, at least one of the heatsink metal bars in the second substrate is capable to be sized as large as about 95% of a horizontal area of the second substrate.

According to one embodiment, the SIP further includes a second die deposed over the second substrate. Herein, the at least one heatsink stanchion of the second substrate includes a first heatsink stanchion and a second heatsink stanchion. The first heatsink stanchion of the second substrate is connected to the at least one heatsink stanchion of the substrate, and the second heatsink stanchion of the second substrate is connected to the second die, such that heat generated by the second die can be dissipated by the second heatsink stanchion of the second substrate.

In one embodiment of the SIP, the second die is a flip-chip die, which includes a second die body and a number of second interconnects configured to connect the second die body and the second substrate. Herein, one of the second interconnects connects the second die body and the second heatsink stanchion of the second substrate.

In one embodiment of the SIP, the second die is a wire-bonding die, which includes a second die body and a number of bonding wires. Herein, the second heatsink stanchion is directly underneath the second die body. The bonding wires electrically connect the second die body to the second substrate.

In one embodiment of the SIP, the second substrate further includes at least one via structure that is electrically connected to the second die. The at least one via structure of the second substrate includes a number of via metal plates and a number of via metal bars, which is alternated with these via metal plates. One heatsink metal bar of the second heatsink stanchion in the second substrate is more than ten times larger than one of the via metal bars of the second substrate in a horizontal plane.

According to one embodiment, the SIP further includes a mold compound that resides over the second substrate and at least partially encapsulates the chiplet and at least partially encapsulates the second die.

According to one embodiment, the SIP further includes a heatsink spreader over the second die and the chiplet. Herein, the first die is a flip-chip die, which includes a die body and a number of interconnects configured to connect the die body and the substrate. The second die is a flip-chip die, which includes a second die body and a number of second interconnects configured to connect the second die body and the second substrate. The mold compound partially encapsulates the chiplet and the second die, such that a top surface of the die body of the first die and a top surface of the second die body of the second die are exposed through the mold compound. The heatsink spreader is in contact with the top surface of the die body of the first die and the top surface of the second die body of the second die.

In one embodiment of the SIP, the heatsink spreader includes one or more secondary heatsink stanchions directly attached to the top surface of the die body of the first die and the top surface of the second die body of the second die. Each of the one or more secondary heatsink stanchions includes a number of heatsink metal plates and a number of heatsink metal bars, which is alternated with these heatsink metal plates.

In one embodiment of the SIP, the second substrate further includes an antenna structure residing in the dielectric layers of the second substrate. Herein, the antenna structure is laterally offset from the chiplet, and connected to the at least one heatsink stanchion of the second substrate, such that heat generated by the antenna structure can be dissipated by the at least one heatsink stanchion within the second substrate.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1A-1H show a chiplet with a flip-chip die over one or more heatsink stanchions according to one embodiment of the present disclosure.

FIGS. 2A-2J provide exemplary steps that illustrate a process to fabricate one heatsink stanchion illustrated in FIGS. 1A-1H.

Figure 3A:
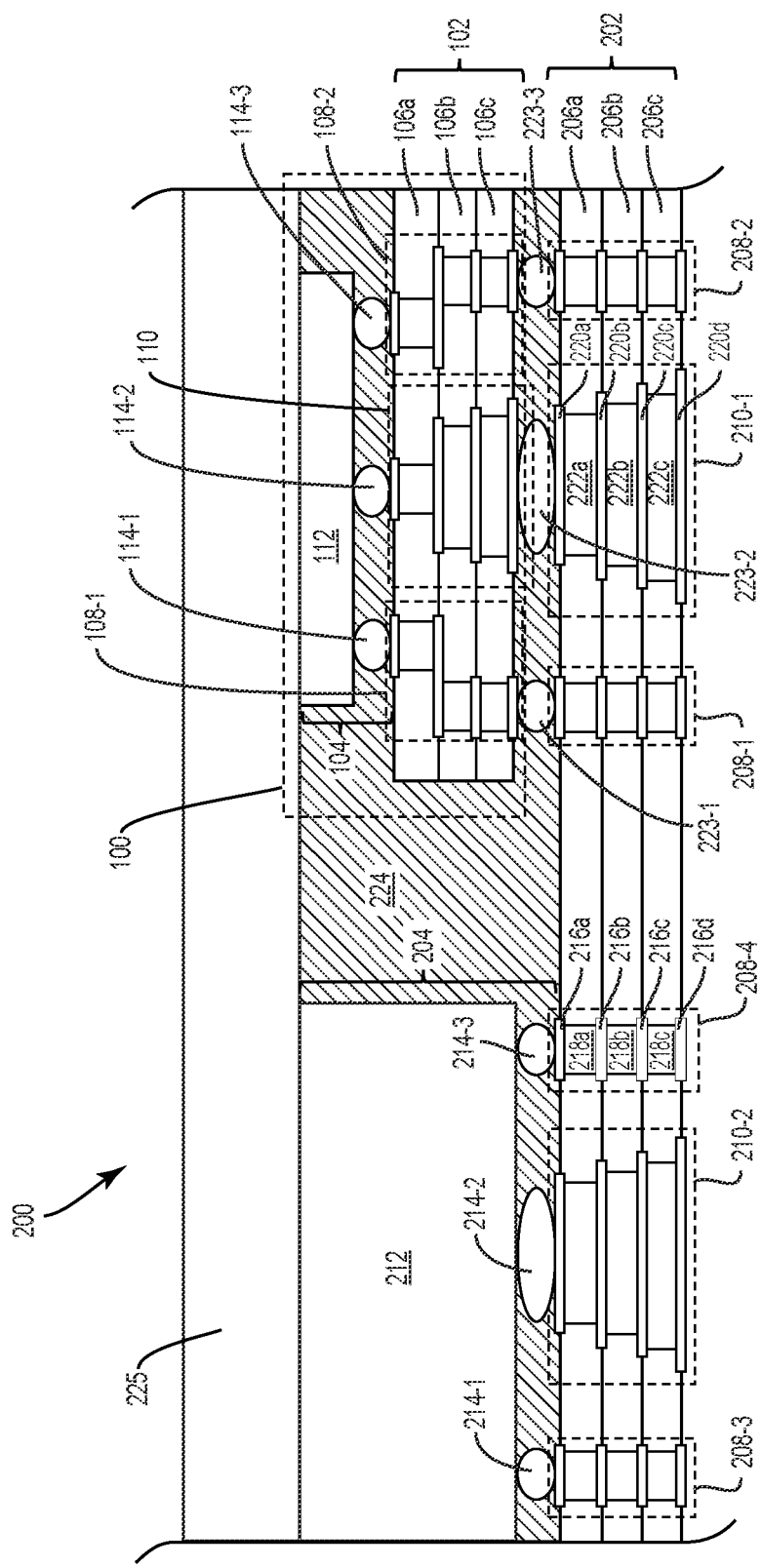
FIGS. 3A-3C show a system in package (SIP) including the chiplet illustrated in FIG. 1A.
Figure 3B:
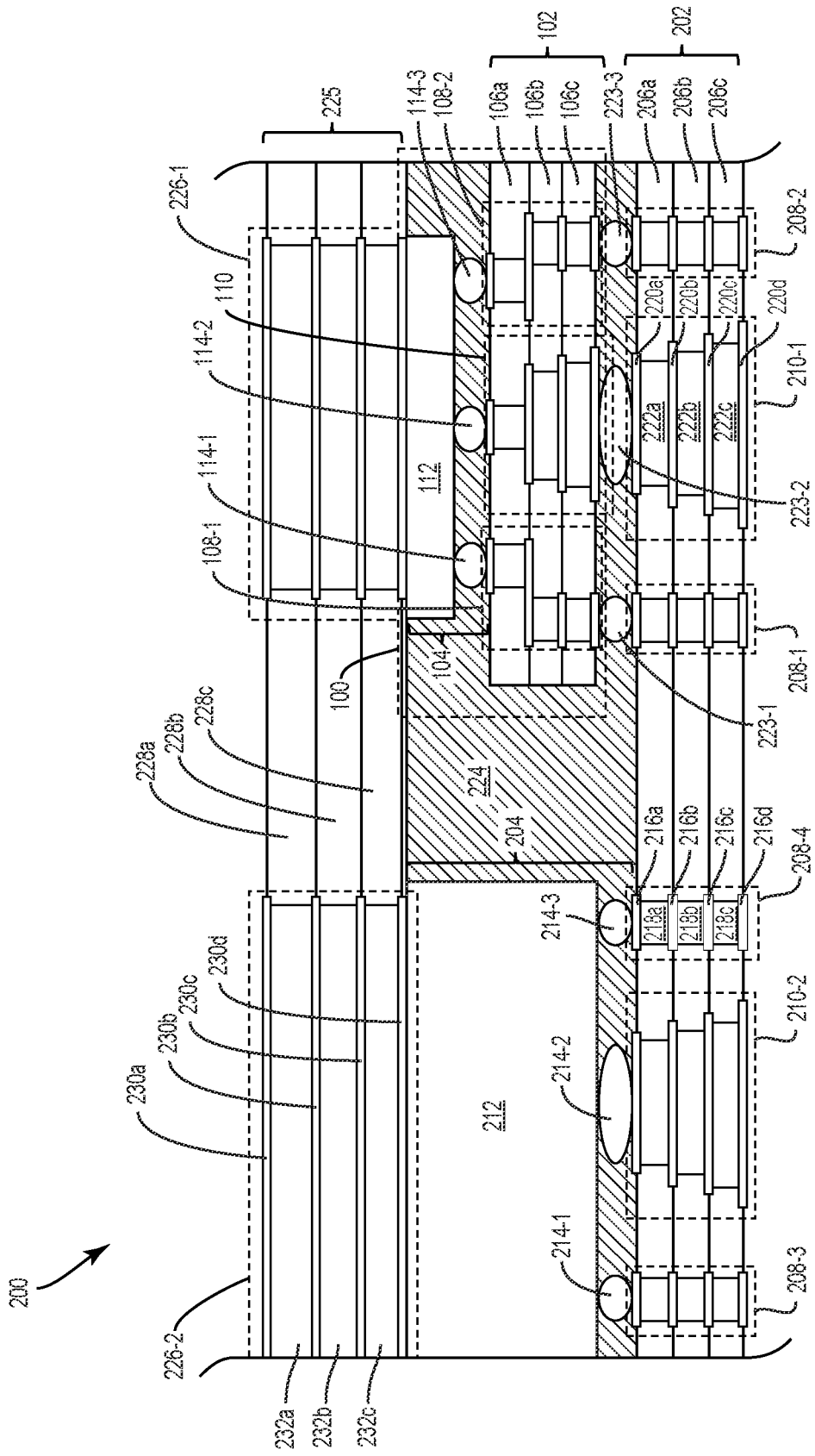
Figure 3C:
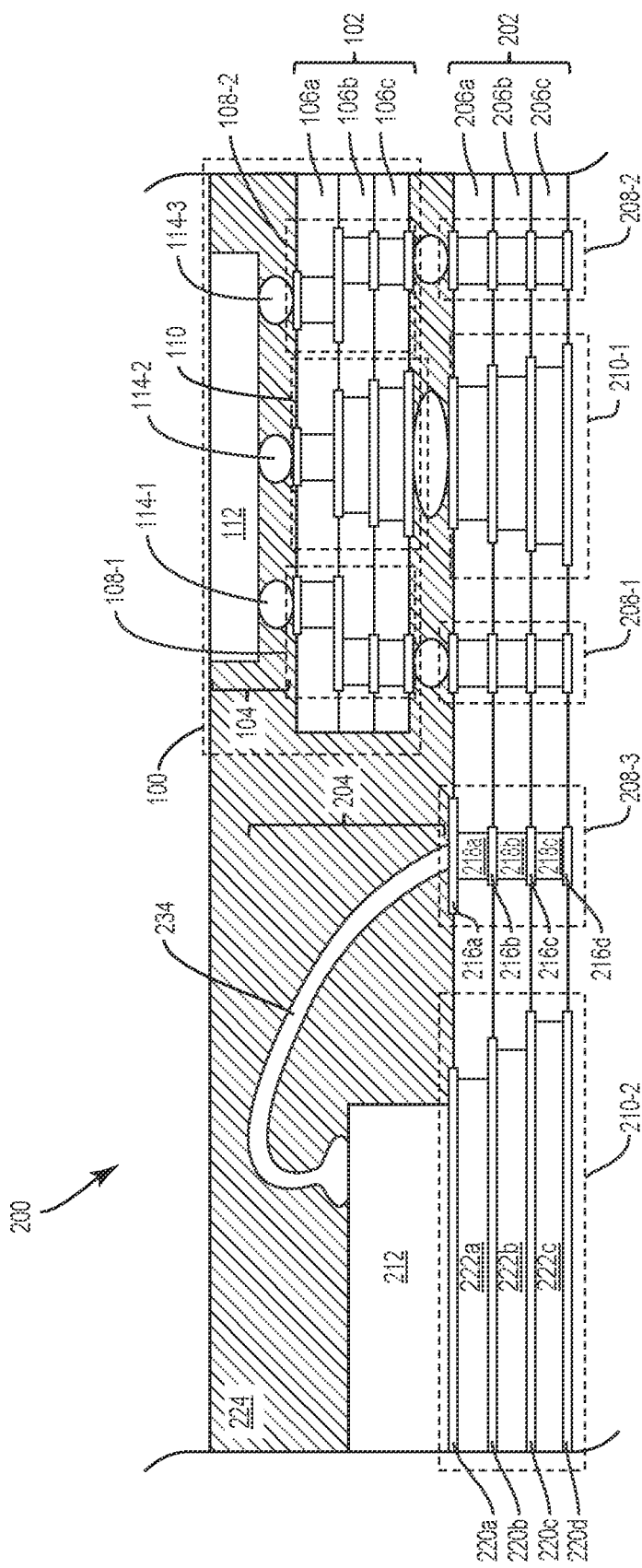

FIGS. 5A-5G provide exemplary steps that illustrate a process to fabricate the SIP illustrated in FIGS. 3A-3C.

It will be understood that for clear illustrations, FIGS. 1A-5G may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

At an ever-increasing rate, high speed and high performance transistors are more densely integrated in semiconductor dies. The amount of heat generated by the semiconductor dies increases significantly due to the growth in number of transistors per semiconductor die, the large amount of power passing through the transistors, and the high operation speed of the transistors. To accommodate these highly heat-generating semiconductor dies, thermal management and material reliability in package designs will meet many challenges. Packages must be designed to provide efficient heat dissipation, such that the semiconductor dies enclosed in the packages can operate at optimal electrical performance.

Figure 1A:
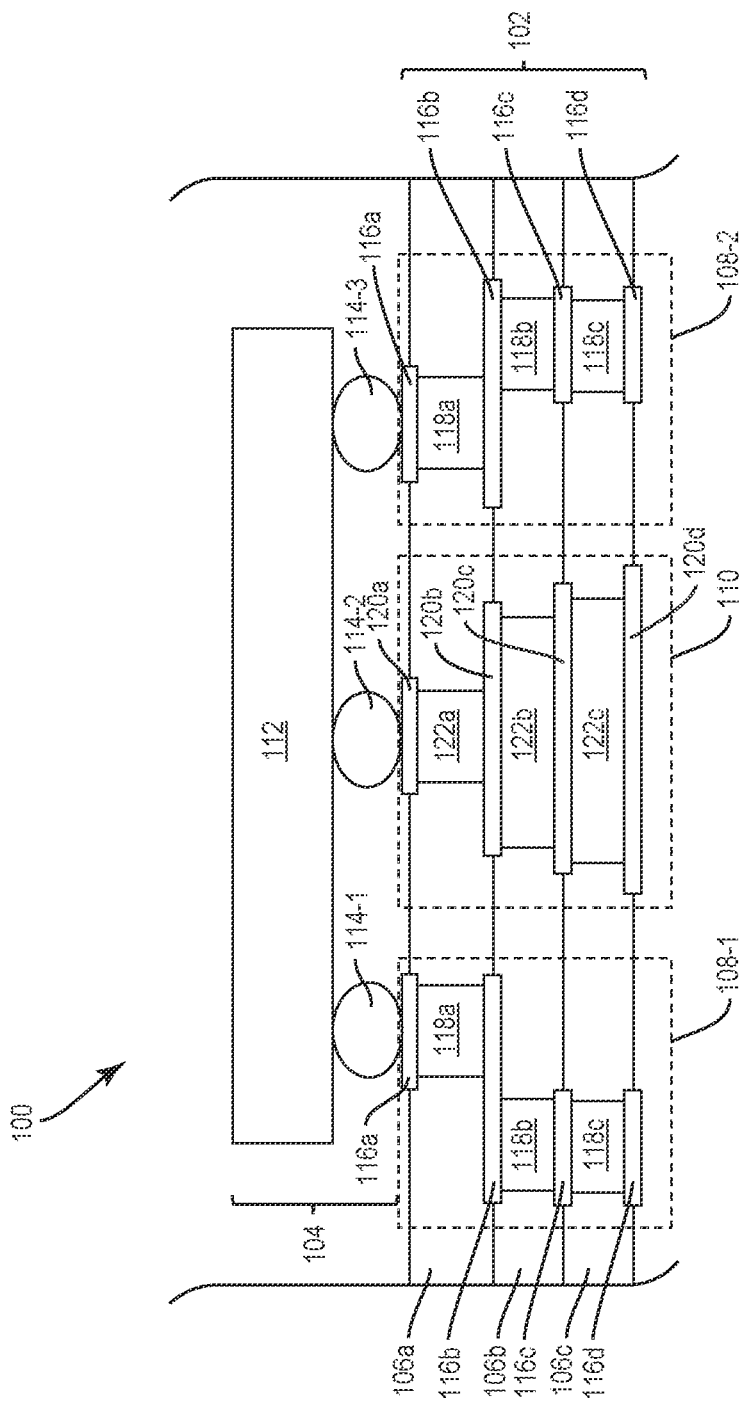

The present disclosure relates to a system in package (SIP) including one or more flip chip dies over one or more multi-layer heatsink stanchions and a process for making the same. FIGS. 1A-1H show an exemplary chiplet, which may be stacked in one SIP (more details of the SIP described below), according to one embodiment of the present disclosure. FIG. 1A provides a chiplet 100 including a substrate 102 and a flip-chip die 104 deposed over the substrate 102.

In detail, the substrate 102 includes multiple dielectric layers 106, one or more via structures 108, and one or more heatsink stanchions 110. The flip-chip die 104 includes a die body 112 and multiple interconnects 114 configured to electrically/thermally connect the die body 112 to the substrate 102. For the purpose of this illustration, the substrate 102 includes three dielectric layers 106 (i.e., a first dielectric layer 106a, a second dielectric layer 106b, and a third dielectric layer 106c), two via structures 108 (i.e., a first via structure 108-1 and a second via structure 108-2) extending through the three dielectric layers 106, and the heatsink stanchion 110 that extends through the three dielectric layers 106 and is located laterally between the two via structures 108. The flip-chip die 104 includes three interconnects 114 (i.e., a first interconnect 114-1, a second interconnect 114-2, and a third interconnect 114-3). In different applications, the substrate 102 may include fewer or more dielectric layers 106, fewer or more via structures 108, and multiple heatsink stanchions 110, while the flip-chip die 104 may include fewer or more interconnects 114. In addition, the locations of the via structures 108 and the heatsink stanchion 110 may be different. For instance, the heatsink stanchion 110 may be located at one side of the two via structures 108 (not shown).

Herein, the first dielectric layer 106a is formed at a top of the substrate 102, the second dielectric layer 106b is formed underneath the first dielectric layer 106a, and the third dielectric layer 106c is formed underneath the second dielectric layer 106b. Each via structure 108 includes four via metal plates 116a~116d and three via metal bars 118a-118c, which are alternated with the four via metal plates 116a-116d. In one embodiment, a first via metal plate 116a is formed at a top of the first dielectric layer 106a, a second via metal plate 116b is formed at a junction of the first dielectric layer 106a and the second dielectric layer 106b, a third via metal plate 116c is formed at a junction of the second dielectric layer 106b and the third dielectric layer 106c, and a fourth via metal plate 116d is formed at a bottom of the third dielectric layer 106c. In addition, a first via metal bar 118a extends through the first dielectric layer 106a and connects the first via metal plate 116a and the second via metal plate 116b, a second via metal bar 118b extends through the second dielectric layer 106b and connects the second via metal plate 116b and the third via metal plate 116c, and a third via metal bar 118c extends through the third dielectric layer 106c and connects the third via metal plate 116c and the fourth via metal plate 116d. Each via structure 108 is configured to transmit/receive the RF signals to/from the flip-chip die 104).

The heatsink stanchion 110 is also multi-layered and includes four heatsink metal plates 120a~120d and three heatsink metal bars 122a-122c, which are alternated with the four heatsink metal plates 120a-120d. In one embodiment, a first heatsink metal plate 120a is formed at the top of the first dielectric layer 106a, a second heatsink metal plate 120b is formed at the junction of the first dielectric layer 106a and the second dielectric layer 106b, a third heatsink metal plate 120c is formed at the junction of the second dielectric layer 106b and the third dielectric layer 106c, and a fourth heatsink metal plate 120d is formed at the bottom of the third dielectric layer 106c. In addition, a first heatsink metal bar 122a extends through the first dielectric layer 106a and connects the first heatsink metal plate 120a and the second heatsink metal plate 120b, a second heatsink metal bar 122b extends through the second dielectric layer 106b and connects the second heatsink metal plate 120b and the third heatsink metal plate 120c, and a third heatsink metal bar 122c extends through the third dielectric layer 106c and connects the third heatsink metal plate 120c and the fourth heatsink metal plate 120d.

In one embodiment, the via structures 108 and the heatsink stanchion 110 are fabricated using a same metallization process. As such, the first via metal plate 116a and the first heatsink metal plate 120a may be formed from a same first metal layer, the second via metal plate 116b and the second heatsink metal plate 120b may be formed from a same second metal layer, the third via metal plate 116c and the third heatsink metal plate 120c may be formed from a same third metal layer, and the fourth via metal plate 116d and the fourth heatsink metal plate 120d may be formed from a same fourth metal layer. The first via metal bar 118a and the first heatsink metal bar 122a may have a same height and be compliant with a height of the first dielectric layer 106a, the second via metal bar 118b and the second heatsink metal bar 122b may have a same height and be compliant with a height of the second dielectric layer 106b, and the third via metal bar 118c and the third heatsink metal bar 122c may have a same height and be compliant with a height of the third dielectric layer 106c.

The heatsink stanchion 110 is configured in a manner that provides an efficient conducting path of heat generated by the flip-chip die 104 during operation. In one embodiment, the heatsink metal bars 122 are configured in a layered-cake shape to increase the heat conducting efficiency, where the first heatsink metal bar 122a has a smaller size (in the horizontal plane) than the second heatsink metal bar 122b, and the second heatsink metal bar 122b has a smaller size (in the horizontal plane) than the third heatsink metal bar 122c. In addition, each heatsink metal plate 120 is not smaller (in the horizontal plane) than its connecting heatsink metal bar(s) 122, and there might be overhang between the two adjacent heatsink metal bars 122 (e.g., between the first and the second heatsink metal bars 122a and 122b, and between the second and the third heatsink metal bars 122b and 122c). The heatsink metal bars 122 in the heatsink stanchion 110 may be sized larger than about ten times an area of one via metal bar 118 (in the horizontal plane). In some cases, the heatsink metal bars 122 in the heatsink stanchion 110 may be sized as large as about dimensions of the flip-chip die 104 (in the horizontal plane), or even larger than the dimensions of the flip-chip die 104, but not beyond outlines of the chiplet 100 (e.g., no larger than 95% of a horizontal area of the chiplet 100/a horizontal area of the first substrate 102). Each of the heatsink metal bars 122 may have a shape of a cube, a cylinder, a triangular prism, trapezoidal prism, or etc.

The dielectric layers 106 may be formed from laminates such as FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. In some embodiments, the dielectric layers 106 may comprise glass, quartz, ceramic, silicon, alumina, aluminum nitride, and/or resin-based materials such as build-up films, bismaleimide-triazine, and/or polytrafluoroethylene (PTFE). In some embodiments, the dielectric layers 106 may be composed of plastic, polydimethylsiloxane (PDMS), and/or other materials utilized in biological applications, such as micro-fluidics. The via metal plates 116 of the via structures 108 and the heatsink metal plates 120 of the heatsink stanchion 110 may be formed from copper (Cu), gold (Au), silver (Ag), Nickel (Ni), metallic alloys, and/or the like. The via metal bar 118 of the via structures 108 and the heatsink metal bars 122 of the heatsink stanchion 110 may be formed from Cu, Au, Ag, Ni, metallic alloys, and/or the like.

On the other hand, the die body 112 of the flip-chip die 104 may include various semiconducting materials, such as silicon (Si), Gallium Arsenide (GaAs), GaAs on Si, Gallium Nitride (GaN), GaN on Si, GaN on Silicon Carbide (SiC), and/or other material(s) that can form electrical circuitry (e.g., radio frequency circuitry). Furthermore, the die body 112 may include various piezoelectric materials, such that Bulk Acoustic Wave (BAW) resonators/filters and/or Surface Acoustic Wave (SAW) resonators/filters can be formed in the flip-chip die 104.

The interconnects 114 may be solder bumps, Cu pillars, or other suitable interconnecting structures. For the purpose of this illustration, the first interconnect 114-1 is connected to the first via structures 108-1 by directly contacting the first via metal plate 116a, the second interconnect 114-2 is connected to the heatsink stanchion 110 by directly contacting the first heatsink metal plate 120a, and the third interconnect 114-3 is connected to the second via structure 108-2 by directly contacting the first via metal plate 116a. Due to the size differences between the via structures 108 and the heatsink stanchion 110, the second interconnect 114-2 may be larger than the first and third interconnects 114-1 and 114-3.

In some applications, the heatsink stanchion 110 may achieve both electrical and thermal functions. For instance, the heatsink stanchion 110 electrically connects the flip-chip die 104 to ground. For another instance, the heatsink stanchion 110 may carry RF signals (e.g., provides/receives RF signals to/from the flip-chip die 104) by connecting to electrical metal traces within the substrate 102 (not shown).

Figure 1B:
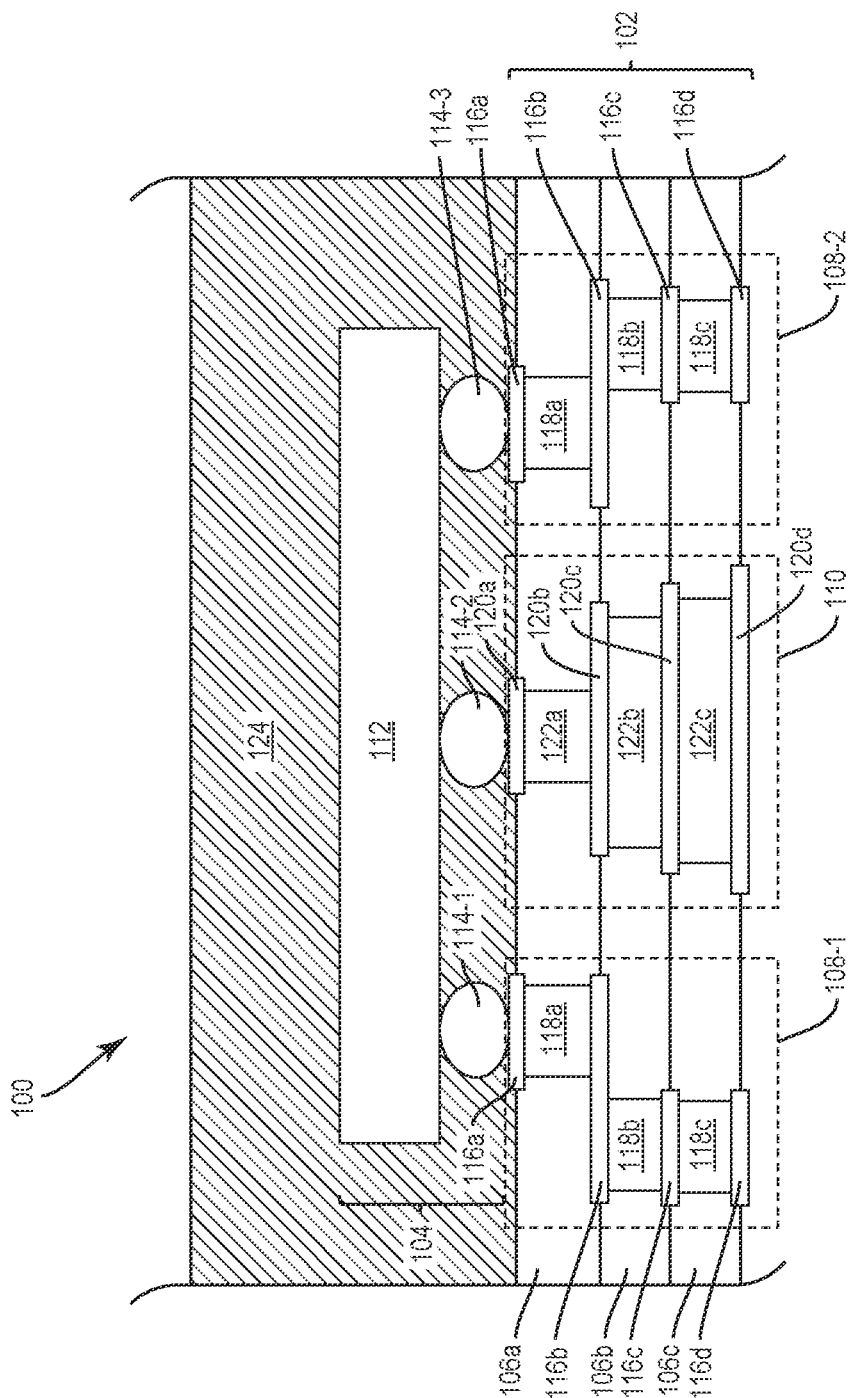

In some applications, the chiplet 100 may further include an enclosure residing over the substrate 102 to at least partially encapsulate the flip-chip die 104. As illustrated in FIG. 1B, a mold compound 124 is the enclosure, which directly covers each side of the flip-chip die 104 and underfills gaps between the die body 112 and the substrate 102. The mold compound 124 may include composite plastic materials and resins. In one embodiment, the mold compound 124 may be ground to expose a backside of the flip-chip die 104 (not shown). As such, the backside of the flip-chip die 104 is eligible to connect to external component(s). For instance, a heatsink spreader (not shown) might be attached to the exposed backside of the flip-chip die 104 for purposes of further radiating thermal energy from the flip-chip die 104.

Figure 1C:
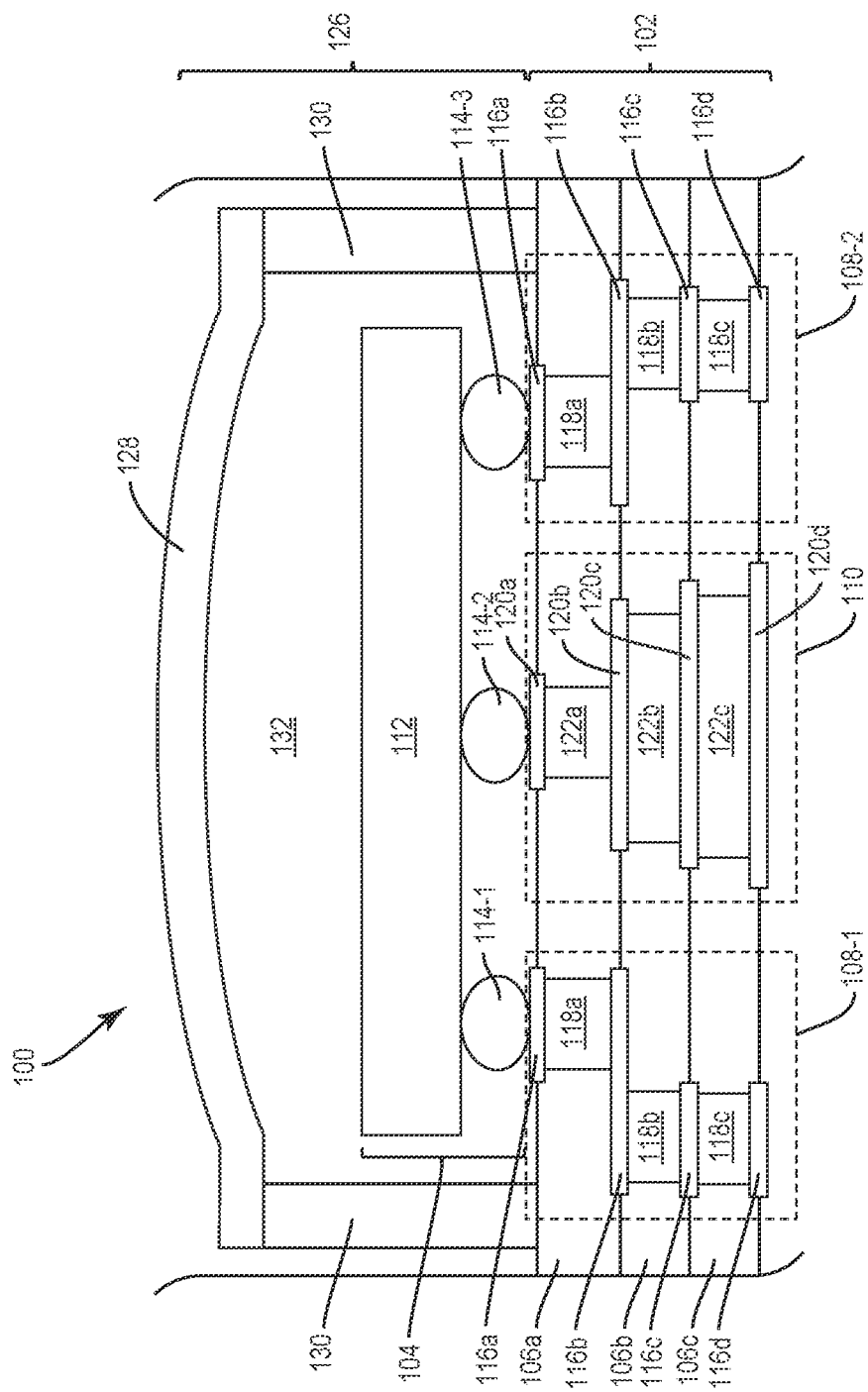

In FIG. 1C, an enclosure 126 includes a cap 128 and an outer wall 130 that extends from the cap 128 toward a top surface of the substrate 12 to form an air cavity 132. The cap 128 may cover a portion of a top surface of the outer wall 130, may fully cover the top surface of the outer wall 130 (not shown), or may even extend laterally beyond the outer wall 130 (not shown). Typically, the outer wall 130 does not directly reside over the via metal plates 116 or the heatsink metal bars 122. The flip-chip die 104 resides within the air cavity 132. The cap 128 and the outer wall 130 may be formed of TMMF, SU-8, or photo-definable epoxies.

Figure 1D:
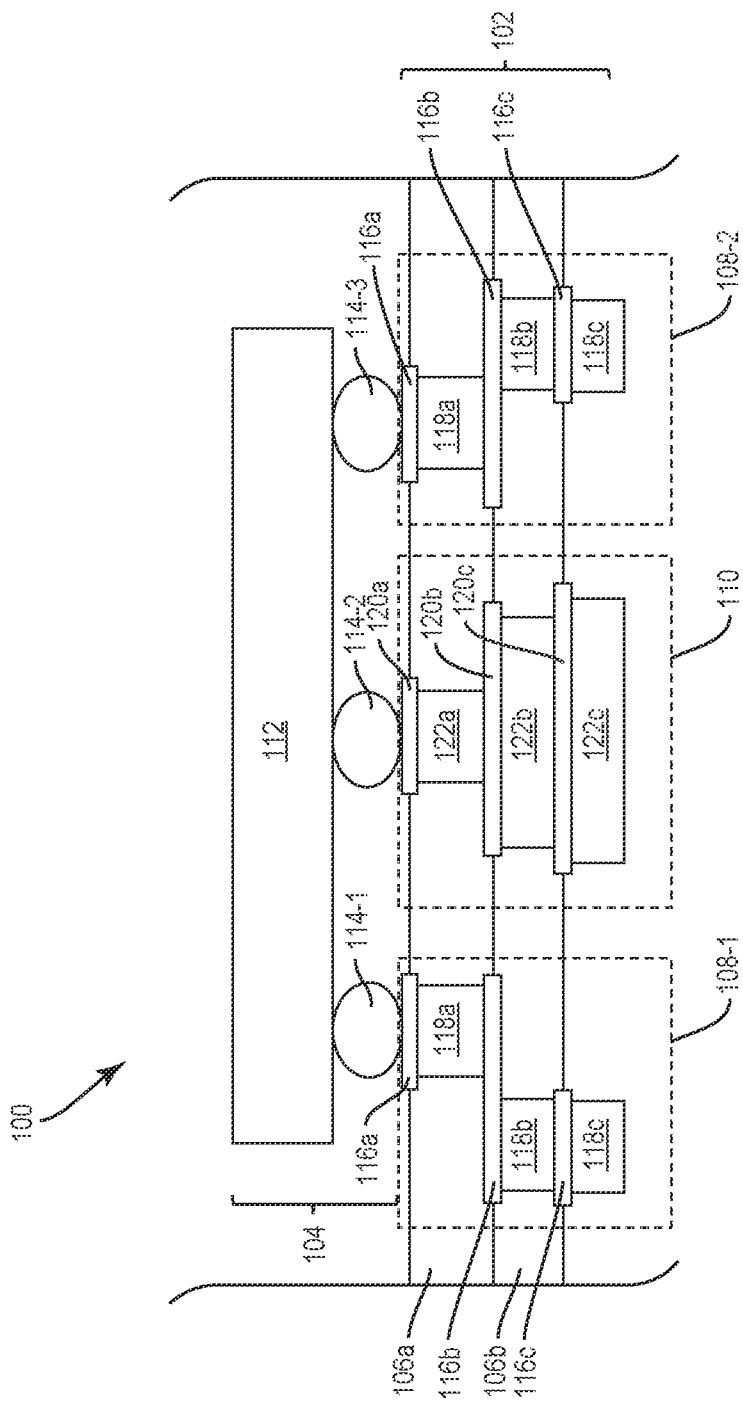

In some applications, the via structures 108 and/or the heatsink stanchion 110 may protrude vertically beyond the dielectric layers 106. As illustrated in FIG. 1D, the via structures 108 and the heatsink stanchion 110 protrude vertically beyond a bottom portion of the dielectric layers 106. For the purpose of this illustration, the substrate 102 only includes two dielectric layers 106a and 106b, and each of the via structures 108 and the heatsink stanchion 110 includes three metal plates and three metal bars.

Herein, the first dielectric layer 106a is formed at the top of the substrate 102, and the second dielectric layer 106b is formed underneath the first dielectric layer 106a. The first via metal plate 116a is formed at the top of the first dielectric layer 106a, the second via metal plate 116b is formed at the junction of the first dielectric layer 106a and the second dielectric layer 106b, and the third via metal plate 116c is formed at the bottom of the second dielectric layer 106b. The first via metal bar 118b extends through the first dielectric layer 106a and connects the first via metal plate 116a and the second via metal plate 116b, and the second via metal bar 118b extends through the second dielectric layer 106b and connects the second via metal plate 116b and the third via metal plate 116c. In addition, the third via metal bar 118c is formed underneath the third via metal plate 116c, where the third via metal bar 118c is not covered by any dielectric layer 106 and protrudes vertically beyond the bottom portion of the dielectric layers 106.

Similarly, for the heatsink stanchion 110, the first heatsink metal plate 120a is formed at the top of the first dielectric layer 106a, the second heatsink metal plate 120b is formed at the junction of the first dielectric layer 106a and the second dielectric layer 106b, and the third heatsink metal plate 120c is formed at the bottom of the second dielectric layer 106b. The first heatsink metal bar 122a extends through the first dielectric layer 106a and connects the first heatsink metal plate 120a and the second heatsink metal plate 120b, and the second heatsink metal bar 122b extends through the second dielectric layer 106b and connects the second heatsink metal plate 120b and the third heatsink metal plate 120c. In addition, the third heatsink via metal bar 122c is formed underneath the third heatsink metal plate 120c, where the third heatsink metal bar 122c is not covered by any dielectric layer 106 and protrudes vertically beyond the bottom portion of the dielectric layers 106.

Figure 1E:
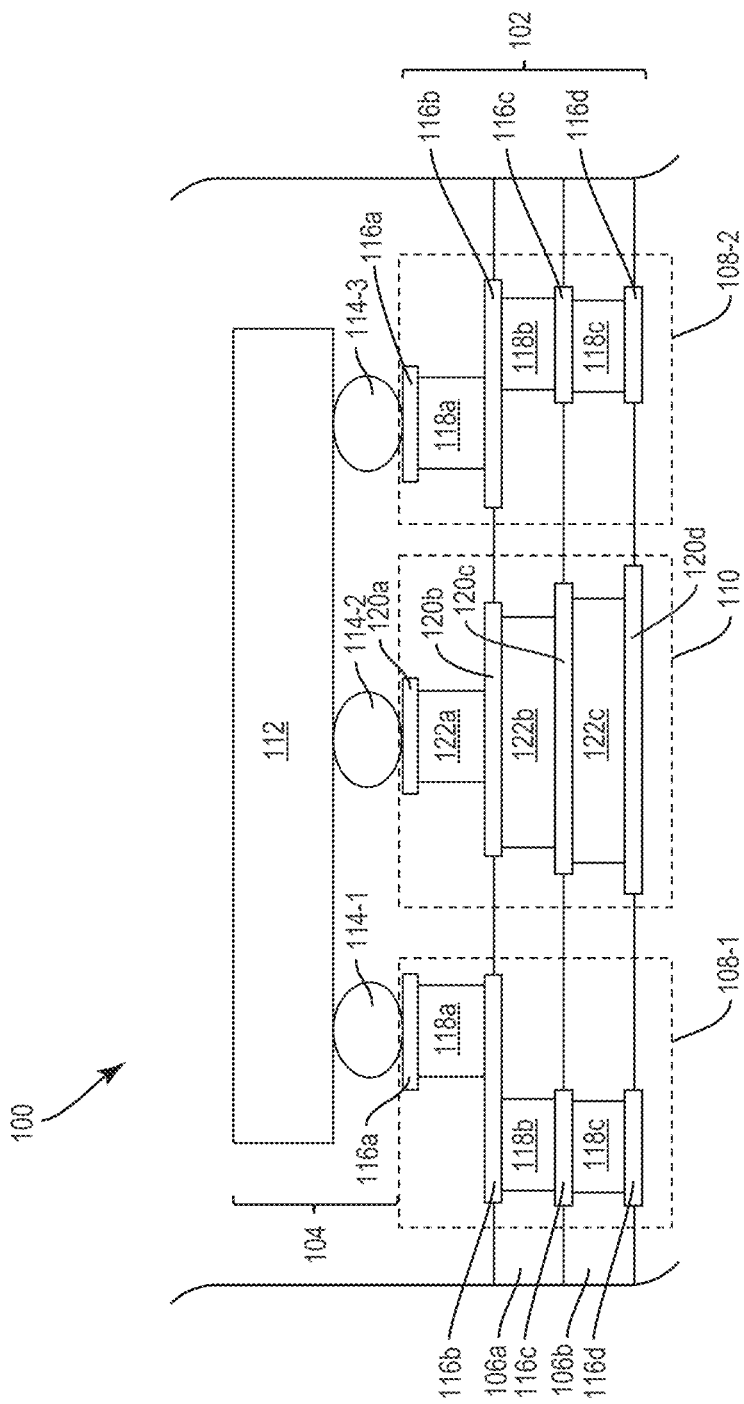

In FIG. 1E, the via structures 108 and the heatsink stanchion 110 protrude vertically beyond a top portion of the dielectric layers 106. For the purpose of this illustration, the substrate 102 only includes two dielectric layer 106a and 106b, while each of the via structures 108 and the heatsink stanchion 110 retains four metal plates and three metal bars.

Herein, the second dielectric layer 106b is formed at the bottom of the substrate 102, and the first dielectric layer 106a is formed over the second dielectric layer 106b. The second via metal plate 116b is formed at the top of the first dielectric layer 106a, the third via metal plate 116c is formed at the junction of the first dielectric layer 106a and the second dielectric layer 106b, and the fourth via metal plate 116d is formed at the bottom of the second dielectric layer 106b. The second via metal bar 118b extends through the first dielectric layer 106a and connects the second via metal plate 116b and the third via metal plate 116c, and the third via metal bar 118c extends through the second dielectric layer 106b and connects the third via metal plate 116c and the fourth via metal plate 116d. In addition, the first via metal bar 118a is formed over the second via metal plate 116b and connects the second via metal plate 116b to the first via metal plate 116a, where the first via metal bar 118a and the first via metal plate 116a are not covered by any dielectric layer 106 and protrude vertically beyond the top portion of the dielectric layers 106.

For the heatsink stanchion 110, the second heatsink metal plate 120b is formed at the top of the first dielectric layer 106a, the third heatsink metal plate 120c is formed at the junction of the first dielectric layer 106a and the second dielectric layer 106b, and the fourth heatsink metal plate 120d is formed at the bottom of the second dielectric layer 106b. The second heatsink metal bar 122b extends through the first dielectric layer 106a and connects the second heatsink metal plate 120b and the third heatsink metal plate 120c, and the third heatsink metal bar 122c extends through the second dielectric layer 106b and connects the third heatsink metal plate 120c and the fourth heatsink metal plate 120d. In addition, the first heatsink via metal bar 122a is formed over the second heatsink metal plate 120b and connects the second heatsink metal plate 120b and the first heatsink metal plate 120a, where the first heatsink metal bar 122a and the first heatsink metal plate 120a are not covered by any dielectric layer 106 and protrude vertically beyond the top portion of the dielectric layers 106.

In FIGS. 1D and 1E, the heatsink metal bars 122 of the heatsink stanchion 110 are still configured in a layered-cake shape to increase the heat conducting efficiency. The heatsink metal bars 122 may be sized larger than about ten times the area of one via metal bar 118 (in the horizontal plane). In some cases, some heatsink metal bars 122 in the heatsink stanchion 110 may be sized as large as about the dimensions of the flip-chip die 104 (in the horizontal plane), or even larger than the dimensions of the flip-chip die 104, but not beyond outlines of the chiplet 100 (e.g., no larger than 95% of the horizontal area of the chiplet 100). Each heatsink metal plate 120 may be not smaller (in the horizontal plane) than its connecting heatsink metal bar(s) 122, and there might be overhang between the two adjacent heatsink metal bars 122. Furthermore, the flip-chip die 104 is still deposed over the substrate 102 by connecting each interconnect 114 to a corresponding metal plate 116a/120a.

Figure 1F:
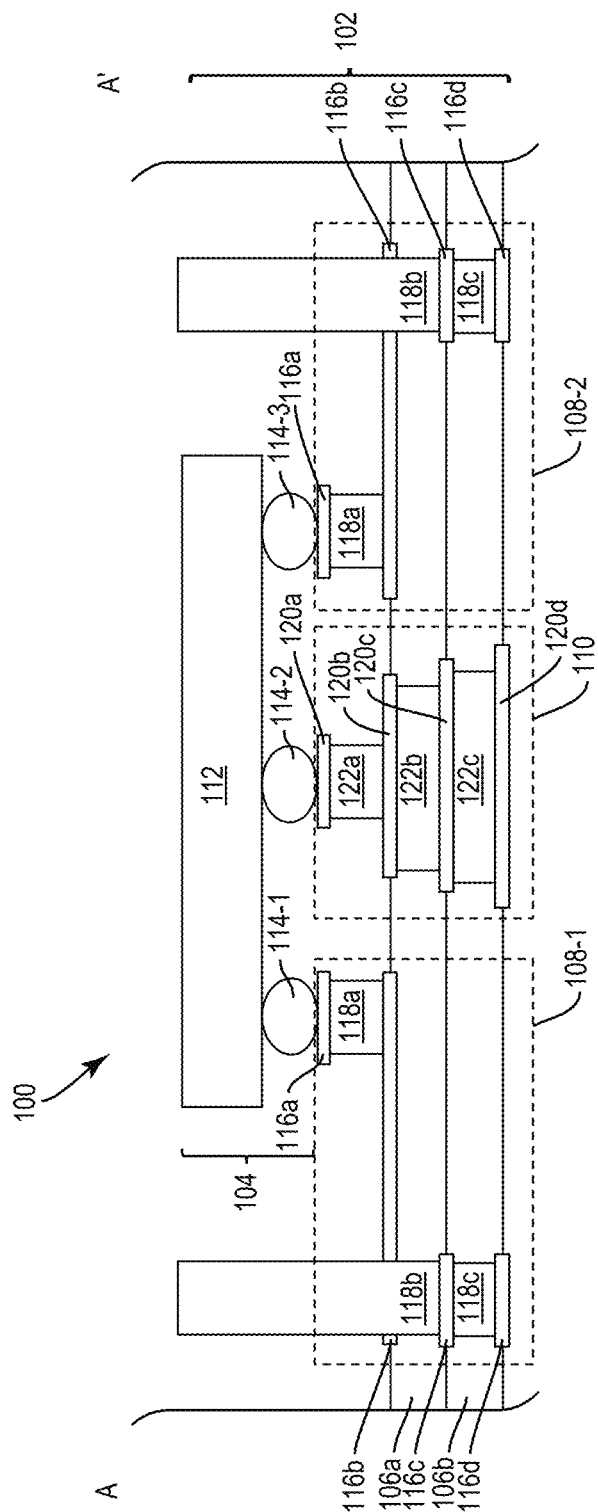
Figure 1G:
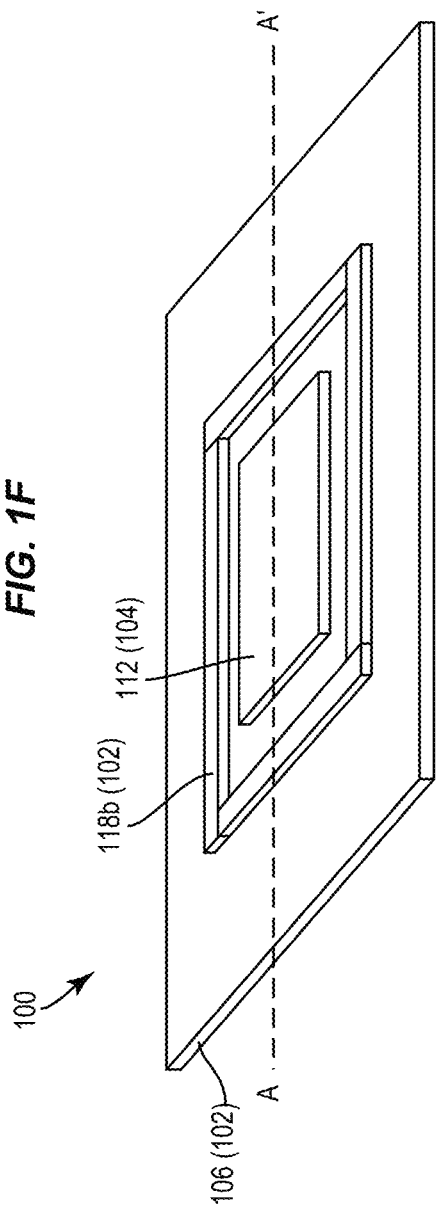

In one embodiment, the via structures 108 may include some via metal bars 118, which are located beyond horizontal outlines of the flip-chip die 104 and extend vertically to form one or more grounded metal walls for the flip-chip die 104. As illustrated in FIG. 1F (a cross-section view along dashed line A-A') and 1G (a perspective view), the second via metal bar 118b and the third via metal bar 118c of each via structure 108 are located beyond the horizontal outlines of the flip-chip die 104. Herein, each second via bar 118b penetrates vertically through the corresponding second via plate 116b (i.e. protruding vertically above the second via bar plate 116b and the dielectric layers 116) to form a grounded metal wall. These grounded metal walls surround the flip-chip die 104 and may be configured as one continuous circular or several straight/curved strips. These grounded metal walls help preserve/enhance out-of-band isolation from an input of the flip-chip die 104 to an output of the flip-chip die 104 (e.g., if the flip-chip die 104 is a filter die, out-of-band isolation from a filter input to a filter output).

In one embodiment, the chiplet 100 may further include grounded features near the input and the output of the flip-chip die 104 to control the characteristic impedance of transmission lines connecting the flip-chip die 104 (not shown).

Figure 1H:
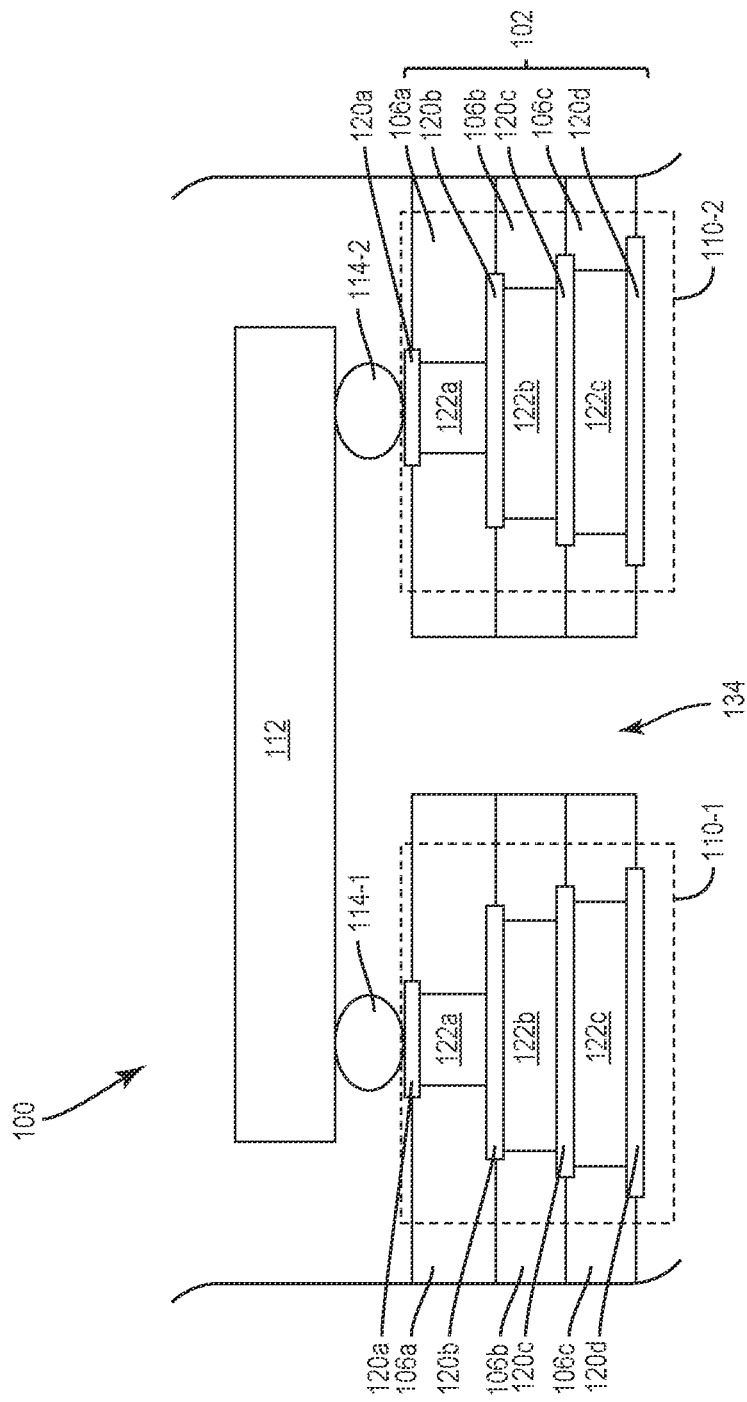

In some applications, the substrate 102 may include an opening 134 straddled by the flip-chip die 104, as illustrated in FIG. 1H. For the purpose of this illustration, the substrate 102 includes three dielectric layers 106a~106c, two heatsink stanchions 110-1 and 110-2 (a first heatsink stanchion 110-1 and a second heatsink stanchion 110-2 instead of two via structures 108 and one heatsink stanchion 110) extending vertically through the dielectric layers 106, and the opening 134 that extends vertically through the dielectric layers 106 and separates the heatsink stanchions 110-1 and 110-2. The flip-chip die 104 includes the die body 112 and two interconnects 114 (instead of three interconnects) corresponding to the two heatsink stanchions 110. In different applications, the substrate 102 may also include via structure(s) 108, fewer or more heatsink stanchions 110, while the flip-chip die 104 may include fewer or more interconnects. In addition, the location of the opening 134 in the substrate 102 may be different. Furthermore, each heatsink stanchion 110 may protrude vertically beyond the dielectric layers 106 (not shown).

In this case, since the substrate 102 does not include typical via structures 108, each heatsink stanchion 110 is configured to dissipate heat generated by the flip-chip die 104 as well as to carry RF signals received from/transmitted to the flip-chip die 104. The heatsink metal bars 122 of each heatsink stanchion 110 are still configured in a layered-cake shape to increase the heat conducting efficiency. The flip-chip die 104 is still deposed over the substrate 102 by connecting each interconnect 114 to a corresponding heatsink metal plate 120a. Herein, the die body 112 of the flip-chip die 104 straddling the opening 134 may further improve the heat conducting efficiency. Notice that the heatsink metal plates 120 and the via metal bars 118 of the first heatsink structure 110-1 may have different sizes and/or different shapes compared to the corresponding heatsink metal plates 120 and via metal bars 118 of the second heatsink structure 110-2 (in the horizontal plane, not shown).

FIGS. 2A-2J provide exemplary steps that illustrate a process to fabricate one heatsink stanchion illustrated in FIGS. 1A-1H. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 2A-2J.

Initially, the fourth heatsink metal plate 120d is formed over a carrier 136, as illustrated in FIG. 2A. The fourth heatsink metal plate 120d is formed by depositing a first metal layer 138 over the carrier 136 and patterning the first metal layer 138 to obtain a desired shape for the fourth heatsink metal plate 120d (not shown). Herein, depositing the fourth metal layer 138 is provided by chemical/sputter deposition, or other metalized film deposition techniques. Patterning the fourth metal layer 138 is provided by using a dry photosensitive film (not shown) and a chemical/plasma etch removal process.

The third dielectric layer 106c with an opening 140 is then formed over the carrier 136 and partially covers the fourth heatsink metal plate 120d, as illustrated in FIG. 2B. Herein, the third dielectric layer 106c with the opening 140 may be formed by using a masking and chemical/plasma etch removal process. The opening 140 is configured to accommodate the third heatsink metal bar 122c. In some cases, the opening 140 may be as large as about the dimensions of the flip-chip die 104 (in the horizontal plane), and in some cases, the opening 140 may be larger than the dimensions of the flip-chip die 104 but not beyond the outlines of the chiplet 100 (not shown). The third heatsink metal bar 122c is formed within the opening 140 as illustrated in FIG. 2C. The third heatsink metal bar 122c may be formed by plating. In different applications, the third dielectric layer 106c may be formed after the third heatsink metal bar 122c. The third dielectric layer 106c may be deposited to encapsulate the third heatsink metal bar 122c, and a grinding/polishing process is followed to thin down the third dielectric layer 106c to expose a top surface of the third heatsink metal bar 122c (not shown). Next, the third heatsink metal plate 120c is formed over the top surface of the third heatsink metal bar 122c, as illustrated in FIG. 2D. In one embodiment, the third heatsink metal plate 120c is larger (in the horizontal plane) than the third heatsink metal bar 122c, and fully covers the third heatsink metal bar 122c.

Figure 2G:
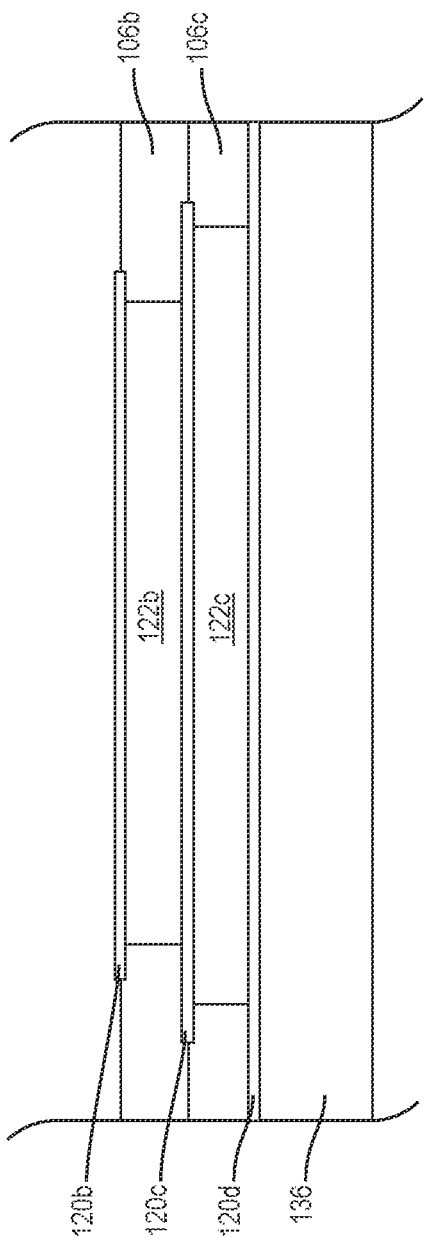

FIGS. 2E-2G provide similar processing steps as FIGS. 2B-2D. The second dielectric layer 106b with an opening 142 is formed over the third dielectric layer 106c and partially covers the third heatsink metal plate 120c, as illustrated in FIG. 2E. Herein, the opening 142 is configured to accommodate the second heatsink metal bar 122b, and may have a smaller size (in the horizontal plane) than the opening 140 within the third dielectric layer 106c. The second heatsink metal bar 122*b* is formed within the opening 142 as illustrated in FIG. 2F. The second heatsink metal bar 122*b* may be formed by plating. In different applications, the second dielectric layer 106*b* may be formed after the second heatsink metal bar 122*b*. The second dielectric layer 106*b* may be deposited to encapsulate the second heatsink metal bar 122*b*, and a grinding/polishing process is followed to thin down the second dielectric layer 106*b* to expose a top surface of the second heatsink metal bar 122*b* (not shown). Next, the second heatsink metal plate 120*b* is formed over the top surface of the second heatsink metal bar 122*b*, as illustrated in FIG. 2G. In one embodiment, the second heatsink metal plate 120*b* is larger (in the horizontal plane) than the second heatsink metal bar 122*b*, and fully covers the second heatsink metal bar 122*b*.

Figure 2H:
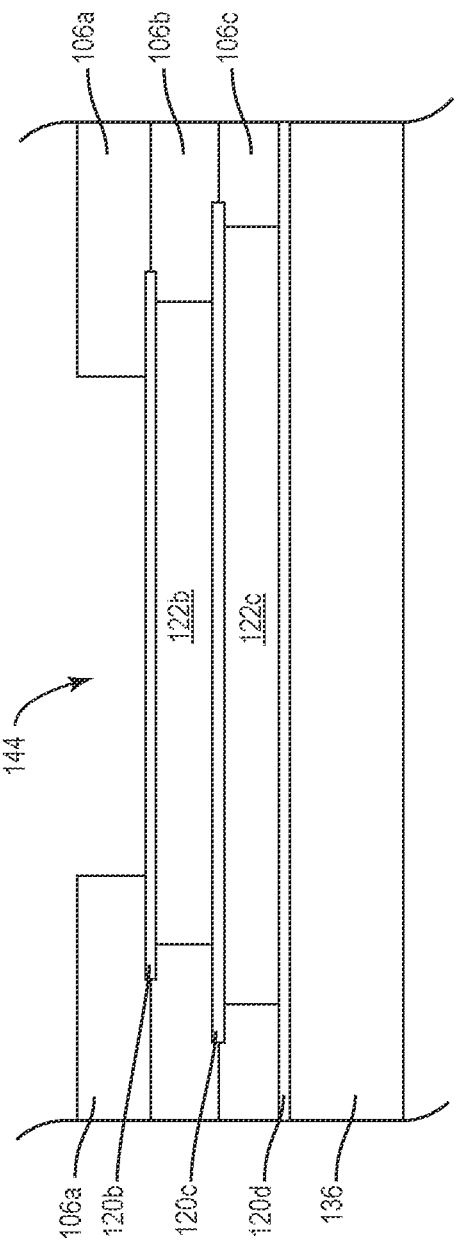

Similarly, FIGS. 2H-2J provide similar processing steps as FIGS. 2E-2G. The first dielectric layer 106*a* with an opening 144 is formed over the second dielectric layer 106*b* and partially covers the second heatsink metal plate 120*b*, as illustrated in the FIG. 2H. Herein, the opening 144 is configured to accommodate the first heatsink metal bar 122*a*, and may have a smaller size (in the horizontal plane) than the opening 142 within the second dielectric layer 106*b*. The first heatsink metal bar 122*a* is formed within the opening 144 as illustrated in FIG. 2I. The first heatsink metal bar 122*a* may be formed by plating. In different applications, the first dielectric layer 106*a* may be formed after the first heatsink metal bar 122*a*. The first dielectric layer 106*a* may be deposited to encapsulate the first heatsink metal bar 122*a*, and a grinding/polishing process is followed to thin down the first dielectric layer 106*a* to expose a top surface of the first heatsink metal bar 122*a* (not shown). Next, the first heatsink metal plate 120*a* is formed over the top surface of the first heatsink metal bar 122*a*, as illustrated in FIG. 2J. In one embodiment, the first heatsink metal plate 120*a* is larger (in the horizontal plane) than the first heatsink metal bar 122*a*, and fully covers the first heatsink metal bar 122*a*. In some applications, the first dielectric layer 106*a* may be omitted or removed substantially, such that the first metal bar 122*a* protrudes beyond the dielectric layers (as shown in FIG. 1D).

FIGS. 3A-3C provide a system in package (SIP) 200 including the chiplet 100 shown in FIG. 1A. Besides the chiplet 100, the SIP 200 may further include a second substrate 202 and a second die 204, where the chiplet 100 and the second die 204 are deposed over the second substrate 202.

As illustrated in FIG. 3A, the second substrate 202 includes multiple dielectric layers 206, one or more via structures 208, and one or more heatsink stanchions 210. The second die 204 is a flip-chip die and includes a second die body 212 and multiple interconnects 214 configured to electrically/thermally connect the second die body 212 to the second substrate 202. For the purpose of this illustration, the second substrate 202 includes three dielectric layers 206 (i.e., a first dielectric layer 206*a*, a second dielectric layer 206*b*, and a third dielectric layer 206*c*), four via structures 208 (i.e., a first via structure 208-1, a second via structure 208-2, a third via structure 208-3, and a fourth via structure 208-4) extending through the three dielectric layers 206, and two heatsink stanchions 210 (i.e., a first heatsink stanchion 210-1 and a second heatsink stanchion 210-2) also extending through the three dielectric layers 206. The first heatsink stanchion 210-1 is located laterally between the first via structure 208-1 and the second via structure 208-2, while the second heatsink stanchion 210-2 is located laterally between the third via structure 208-3 and the fourth via structure 208-4. The second die 204 includes three interconnects 214 (i.e., a first interconnect 214-1, a second interconnect 214-2, and a third interconnect 214-3). In different applications, the second substrate 202 may include fewer or more dielectric layers 206, fewer or more via structures 208, and fewer or more heatsink stanchions 210; while the second die 204 may include fewer or more interconnects 214. In addition, the relative locations of the via structures 208 and the heatsink stanchion 210 may be different within the second substrate 202. For instance, the first heatsink stanchion 210-1 is located at one side of the first via structure 208-1 and the second via structure 208-2. (not shown).

Herein, the first dielectric layer 206*a* is formed at a top of the second substrate 202, the second dielectric layer 206*b* is formed underneath the first dielectric layer 206*a*, and the third dielectric layer 206*c* is formed underneath the second dielectric layer 206*b*. Each via structure 208 includes four via metal plates 216*a*~216*d* and three via metal bars 218*a*-218*c*, which are alternated with the four via metal plates 216*a*~216*d* (only one set of via metal plates 216 and via metal bars 218 in one via structure 208 are labeled with reference numbers for clarity). In one embodiment, a first via metal plate 216*a* is formed at a top of the first dielectric layer 206*a* of the second substrate 202, a second via metal plate 216*b* is formed at a junction of the first dielectric layer 206*a* and the second dielectric layer 206*b*, a third via metal plate 216*c* is formed at a junction of the second dielectric layer 206*b* and the third dielectric layer 206*c*, and a fourth via metal plate 216*d* is formed at a bottom of the third dielectric layer 206*c*. In addition, a first via metal bar 218*a* extends through the first dielectric layer 206*a* and connects the first via metal plate 216*a* and the second via metal plate 216*b*, a second via metal bar 218*b* extends through the second dielectric layer 206*b* and connects the second via metal plate 216*b* and the third via metal plate 216*c*, and a third via metal bar 218*c* extends through the third dielectric layer 206*c* and connects the third via metal plate 216*c* and the fourth via metal plate 216*d*. Notice that, for different via structures 208, the corresponding via metal plates 216 and via metal bars 218 may have different sizes and/or different shapes (in the horizontal plane, not shown). The via structures 208 are configured to transmit/receive the RF signals to/from the second flip-chip die 104 and configured to transmit/receive the RF signals to/from the chiplet 100.

Each heatsink stanchion 210 is also multi-layered and includes four heatsink metal plates 220*a*~220*d* and three heatsink metal bars 222*a*-222*c*, which are alternated with the four heatsink metal plates 220*a*-220*d* (only one set of heatsink metal plates 220 and heatsink metal bars 222 in one heatsink structure 210 are labeled with reference numbers for clarity). In one embodiment, a first heatsink metal plate 220*a* is formed at the top of the first dielectric layer 206*a*, a second heatsink metal plate 220*b* is formed at the junction of the first dielectric layer 206*a* and the second dielectric layer 206*b*, a third heatsink metal plate 220*c* is formed at the junction of the second dielectric layer 206*b* and the third dielectric layer 206*c*, and a fourth heatsink metal plate 220*d* is formed at the bottom of the third dielectric layer 206*c*. In addition, a first heatsink metal bar 222*a* extends through the first dielectric layer 206*a* and connects the first heatsink metal plate 220*a* and the second heatsink metal plate 222*b*, a second heatsink metal bar 222*b* extends through the second dielectric layer 206*b* and connects the second heatsink metal plate 220*b* and the third heatsink metal plate 220*c*, and a third heatsink metal bar 222*c* extends through the third dielectric layer 206*c* and connects the third heatsink metal plate 220*c* and the fourth heatsink metal plate 220*d*.

The heatsink stanchions 210 are configured in a manner that provides an efficient conducting path of heat generated by the second die 204 or generated by the chiplet 100 during operation. In one embodiment, the heatsink metal bars 222 are configured in a layered-cake shape to increase the heat conducting efficiency, where the first heatsink metal bar 222a has a smaller size (in the horizontal plane) than the second heatsink metal bar 222b, and the second heatsink metal bar 222b has a smaller size (in the horizontal plane) than the third heatsink metal bar 222c. In addition, each heatsink metal plate 220 is not smaller (in the horizontal plane) than its connecting heatsink metal bar(s) 222, and there might be overhang between adjacent two heatsink metal bars 222 (e.g., between the first and the second heatsink metal bars 222a and 222b, and between the second and the third heatsink metal bars 222b and 222c). The heatsink metal bars 222 in the heatsink stanchion 210 may be sized larger than about ten times an area of one via metal bar 218. In some cases, some heatsink metal bars 222 in the heatsink stanchion 210 may be sized as large as about dimensions of the second die 204 (in the horizontal plane), or even larger than the dimensions of the second die 204 or beyond the outlines of the chiplet 100, but never beyond outlines of the SIP 200 (e.g., no larger than 95% of a horizontal area of the SIP 200/a horizontal area of the second substrate 202).

Each of the heatsink metal bars 222 may have a shape of a cube, a cylinder, a triangular prism, trapezoidal prism, or etc. . . . . Notice that, for different heatsink structures 210, the corresponding heatsink metal plates 220 and heatsink metal bars 222 may have different sizes and/or different shapes (in the horizontal plane, as illustrated in FIG. 3C and described in following paragraphs).

In one embodiment, the via structures 208 and the heatsink stanchions 210 are fabricated using a same metallization process. As such, the first via metal plate 216a of each via structure 208 and the first heatsink metal plate 220a of each heatsink stanchion 210 may be formed from a same first metal layer, the second via metal plate 216b of each via structure 208 and the second heatsink metal plate 220b of each heatsink stanchion 210 may be formed from a same second metal layer, the third via metal plate 216c of each via structure 208 and the third heatsink metal plate 220c of each heatsink stanchion 210 may be formed from a same third metal layer, and the fourth via metal plate 216d of each via structure 208 and the fourth heatsink metal plate 220d of each heatsink stanchion 210 may be formed from a same fourth metal layer. The first via metal bar 218a of each via structure 208 and the first heatsink metal bar 222a of each heatsink stanchion 210 may have a same height and be compliant with a height of the first dielectric layer 206a, the second via metal bar 218b of each via structure 208 and the second heatsink metal bar 222b of each heatsink stanchion 210 may have a same height and be compliant with a height of the second dielectric layer 206b, and the third via metal bar 218c of each via structure 208 and the third heatsink metal bar 222c of each heatsink stanchion 210 may have a same height and be compliant with a height of the third dielectric layer 206c.

The dielectric layers 206 may be formed from laminates such as FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. In some embodiments, the dielectric layers 206 may comprise glass, quartz, ceramic, silicon, alumina, aluminum nitride, and/or resin-based materials such as build-up films, bismaleimide-triazine, and/or PTFE.

In some embodiments, the dielectric layers 206 may be composed of plastic, PDMS, and/or other materials utilized in biological applications, such as micro-fluidics. The via metal plates 216 of each via structure 208 and the heatsink metal plates 220 of each heatsink stanchion 210 may be formed from Cu, Au, Ag, Ni, metallic alloys, and/or the like. The via metal bar 218 of each via structure 208 and the heatsink metal bars 222 of each heatsink stanchion 210 may be formed from Cu, Au, Ag, Ni, metallic alloys, and/or the like.

In the SIP 200, the chiplet 100 is deposed over the second substrate 202, and connected to the first via structure 208-1, the second via structure 208-2, and the first heatsink stanchion 210-1 by package interconnects 223 (e.g., a first package interconnect 223-1, a second package interconnect 223-2, and a third package interconnect 223-3). In detail, the first via structure 108-1, the second via structure 108-2, and the heatsink stanchion 110 of the substrate 102 in the chiplet 100 are aligned with the first via structure 208-1, the second via structure 208-2, and the first heatsink stanchion 210-1 of the second substrate 202, respectively. The first via structure 108-1 of the substrate 102 is connected to the first via structure 208-1 of the second substrate 202 by the first package interconnect 223-1 and the second via structure 108-2 of the substrate 102 is connected to the second via structure 208-2 of the second substrate 202 by the third package interconnect 223-3, such that the RF signals may be transmitted to/received from the second substrate 202 through the substrate 102. In addition, the heatsink stanchion 110 of the substrate 102 is connected to the first heatsink stanchion 210-1 of the second substrate 202 by the second package interconnect 223-2, such that additional propagation of thermal energy may be accomplished by the combination of the heatsink stanchion 110 of the substrate 102 and the first heatsink stanchion 210-1 of the second substrate 202.

Due to the size differences between the via structures 108/208 and the heatsink stanchions 110/210, the second package interconnect 223-2 may be larger than the first and third package interconnects 223-1 and 223-3. The package interconnects 223 may be solder bumps, Cu pillars, or other suitable interconnecting structures.

In some applications, the first heatsink stanchion 210-1 may achieve both electrical and thermal functions. For instance, the first heatsink stanchion 210-1 electrically connects the chiplet 100 and ground. For another instance, the first heatsink stanchion 210-1 may carry RF signals (e.g., provides/receives RF signals to/from the chiplet 100) by connecting to electrical metal traces within the second substrate 102 (not shown).

The second die 204 is also deposed over the second substrate 202, and connected to the third via structure 208-3, the fourth via structure 208-4, and the second heatsink stanchion 210-2 by the interconnects 214. The second die body 212 of the second die 204 may include various semiconducting materials, such as Si, GaAs, GaAs on Si, GaN, GaN on Si, GaN on SiC, and/or other material(s) that can form electrical circuitry (e.g., radio frequency circuitry). Furthermore, the second die body 212 may include various piezoelectric materials, such that BAW resonators/filters and/or SAW resonators/filters can be formed in the second die 204.

The interconnects 214 may be solder bumps, Cu pillars, or other suitable interconnecting structures. For the purpose of this illustration, the first interconnect 214-1 is connected to the third via structures 208-3 by directly contacting the first via metal plate 216a, the second interconnect 214-2 is connected to the second heatsink stanchion 210-2 by directly contacting the first heatsink metal plate 220a, and the third interconnect 214-3 is connected to the fourth via structure 208-4 by directly contacting the first via metal plate 216a. Due to the size differences between the via structures 208 and the heatsink stanchions 210, the second interconnect 214-2 may be larger than the first and third interconnects 214-1 and 214-3. In some applications, the second heatsink stanchion 210-2 may achieve both electrical and thermal functions. For instance, the second heatsink stanchion 210-2 electrically connects the second die 204 and ground. For another instance, the second heatsink stanchion 210-2 may carry RF signals (e.g., provides/receives RF signals to/from the second die 204) by connecting to electrical metal traces within the second substrate 202 (not shown).

In one embodiment, the SIP 200 may further include an enclosure residing over the second substrate 202 to at least partially encapsulate the second die 204 and the chiplet 100. For the purpose of this illustration, a mold compound 224 is the enclosure, which encapsulates sides of the second die 204, underfills gaps between the second die body 212 and the second substrate 202, encapsulates sides of the chiplet 100 (i.e., encapsulates sides of the flip-chip die 104 and encapsulates sides of the substrate 102), underfills gaps between the die body 112 and the substrate 102 within the chiplet 100, and underfills gaps between the chiplet 100 and the second substrate 202 (i.e., gaps between the substrate 102 and the second substrate 202). Herein, a backside of the second die 204 (i.e., a top surface of the second die body 212) and the backside of the flip-chip die 104 of the chiplet 100 (i.e., a top surface of the die body 112) are exposed through the mold compound 224. As such, the backside of the second die 204 and the backside of the flip-chip die 104 are eligible to connect to external component(s). For instance, a heatsink spreader 225 might be attached to the exposed backside of the flip-chip die 104 and the exposed backside of the second flip-chip die 204 for purposes of further radiating thermal energy from the flip-chip die 104 and the second flip-chip die 204. The heat spreader 225 may be comprised of Cu, Au, and or an alloy such as CuMo. The heat spreader 225 may have a thickness as little as about 50 microns, and typically about 635 microns. The thickness of the heat spreader 225 is not to be limited to a maximum thickness. The heat spreader 225 may be in contact with the top surface of the die body 112, and/or the die body 212.

In another embodiment, as depicted in FIG. 3B, the heatsink spreader 225 may include one or more secondary heatsink stanchions 226 attached to the top surface of the die body 112 of the flip-chip die 104 in the chiplet 100, and/or the top surface of the die body 212 of the second die 204. For the purpose of this illustration, the heatsink spreader 225 includes three dielectric layers 228 (i.e., a first dielectric layer 228a, a second dielectric layer 228b, and a third dielectric layer 228c), two secondary heatsink stanchions 226 (i.e., a first secondary heatsink stanchion 226-1, and a second secondary heatsink stanchion 226-2) that extends through the dielectric layers 228. The first secondary heatsink stanchion 226-1 is aligned with and thermally coupled to the flip-chip die 104 in the chiplet 100, and the second secondary heatsink stanchion 226-2 is aligned with and thermally coupled to the second die 204. In different applications, the heatsink spreader 225 may include fewer or more dielectric layers 228 and fewer or more secondary heatsink stanchions 226. For instance, the heatsink spreader 225 only includes one secondary heatsink stanchion 226, which is thermally coupled to both the flip-chip die 104 and the second die 204 (not shown).

Herein, the first dielectric layer 228a is formed at a top of the heatsink spreader 225, the second dielectric layer 228b is formed underneath the first dielectric layer 228a, and the third dielectric layer 228c is formed underneath the second dielectric layer 228b and over the flip-chip die 104 and the second die 204.

Each secondary heatsink stanchion 110 is multi-layered and includes four heatsink metal plates 230a~230d and three heatsink metal bars 232a-232c, which are alternated with the four heatsink metal plates 230a-230d. In one embodiment, a first heatsink metal plate 230a is formed at a top of the first dielectric layer 228a, a second heatsink metal plate 230b is formed at a junction of the first dielectric layer 228a and the second dielectric layer 228b, a third heatsink metal plate 230c is formed at a junction of the second dielectric layer 228b and the third dielectric layer 228c, and a fourth heatsink metal plate 230d is formed at a bottom of the third dielectric layer 228c and in contact with the exposed backside of the flip-chip die 104 (i.e., the top surface of the die body 112 of the flip-chip die 104). In addition, a first heatsink metal bar 232a extends through the first dielectric layer 228a and connects the first heatsink metal plate 230a and the second heatsink metal plate 230b, a second heatsink metal bar 232b extends through the second dielectric layer 228b and connects the second heatsink metal plate 230b and the third heatsink metal plate 230c, and a third heatsink metal bar 232c extends through the third dielectric layer 228c and connects the third heatsink metal plate 230c and the fourth heatsink metal plate 230d. The secondary heatsink stanchions 226 may be fabricated using a same metallization process.

In some applications, each heatsink metal bar 232 in one secondary heatsink stanchion 226 may have a same shape and/or same size. In some applications, the secondary heatsink stanchion 226s may have an upside-down layered-cake shape (i.e., the third heatsink metal bar 232c is smaller than the second heatsink metal bar 232b, and the second heatsink metal bar 232b is smaller than the first heatsink metal bar 232a, not shown). In addition, the heatsink metal bars 232 in the secondary heatsink stanchion 226 may be sized as large as about dimensions of the flip-chip die 104 and/or sized as large as about dimensions of the second die 204. In some cases, some heatsink metal bars 232 in the secondary heatsink stanchion 226 may be sized larger than the dimensions of the flip-chip die 104 and/or larger than the dimensions of the second die 204, but not beyond outlines of the heatsink spreader 225. Each of the heatsink metal bars 232 may have a shape of a cube, a cylinder, a triangular prism, trapezoidal prism, or etc.

The dielectric layers 228 may be formed from laminates such as FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. In some embodiments, the dielectric layers 228 may comprise glass, quartz, ceramic, silicon, alumina, aluminum nitride, and/or resin-based materials such as build-up films, bismaleimide-triazine, and/or PTFE. In some embodiments, the dielectric layers 106 may be composed of plastic, PDMS, and/or other materials utilized in biological applications, such as micro-fluidics. The heatsink metal plates 230 and the heatsink metal bars 232 of the secondary heatsink stanchion 226 may be formed from Cu, Au, Ag, Ni, metallic alloys, and/or the like.

In one embodiment, the mold compound 224 may fully encapsulate the second die 204 and the chiplet 100 (not shown). As such, the heatsink spreader 225 is omitted. In one embodiment, the enclosure encapsulating the second die 204 and the chiplet 100 may be implemented by a cap and an outer wall with a similar configuration as the enclosure 126 in FIG. 1C (not shown). The mold compound 224 may include composite plastic materials and resins.

In some applications, the second die 204 is a wire-bonding die and includes the second die body 212 and bonding wires 234 (only one bonding wire is shown for simplicity), as illustrated in FIG. 3C. For the purpose of this illustration, the second die 204 is deposed over the second substrate 202 without the interconnects 214. The second die body 212 is thermally connected to the second heatsink stanchion 210-2, and one bonding wire 234 extends from a top surface of the second die body 212 to the third via structure 208-3.

Herein, the second heatsink stanchion 210-2 directly underneath the second die body 212 retains a layered-cake shape. For superior thermal dissipation, the first heatsink metal bar 222a in the second heatsink stanchion 210-2 has a larger size than the second die body 212 (in the horizontal plane), the second heatsink metal bar 222b in the second heatsink stanchion 210-2 has a larger size than the first heatsink metal bar 222a in the second heatsink stanchion 210-2 (in the horizontal plane), and the third heatsink metal bar 222c in the second heatsink stanchion 210-2 has a larger size than the second heatsink metal bar 222b in the second heatsink stanchion 210-2 (in the horizontal plane). In this embodiment, the heatsink metal plates 220 and heatsink metal bars 222 in the second heatsink stanchion 210-2 are larger than the corresponding heatsink metal plates 220 and heatsink metal bars 222 in the first heatsink stanchion 210-1.

In FIG. 3C, the mold compound 224 is applied over the second substrate 202 to fully encapsulate the second die 204 and partially encapsulates the chiplet 100. As such, no portion of the second substrate 202 is exposed through the mold compound 224, while the backside of the flip-chip die 104 of the chiplet 100 (i.e., the top surface of the die body 112) is exposed through the mold compound 224. In one embodiment, the wire-bonding die 204 and the chiplet 100 may be encapsulated by an enclosure, which is implemented by a cap and an outer wall with a similar configuration as the enclosure 126 in FIG. 1C (not shown).

Figure 4A:
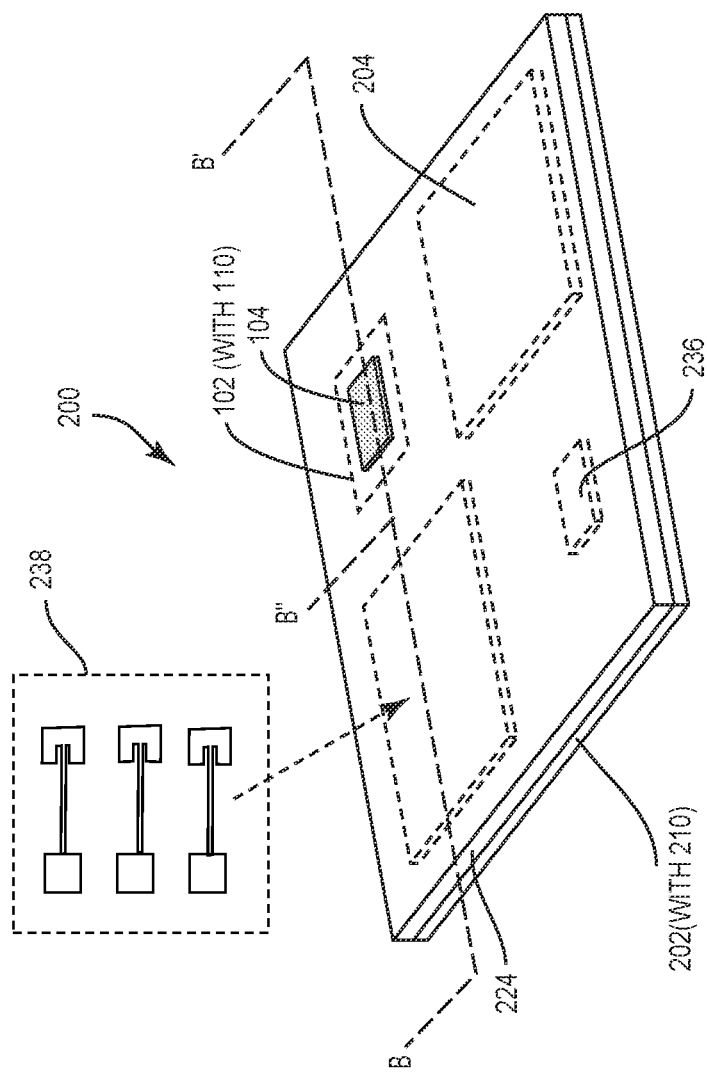
FIGS. 4A-4D shows an alternative SIP including multiple electrical components according to one embodiment of the present disclosure.

Notice that, in FIGS. 3A-3C, the SIP 200 includes the chiplet 100 illustrated in FIG. 1A. In different applications, the SIP 200 may include the chiplet illustrated in any of FIGS. 1B-1H. In addition, the SIP 200 may further include one or more electrical components 236 and one or more antenna structures 238 (one electrical component and one antenna structure are shown for simplicity), as illustrated in FIG. 4A in a perspective view. Herein, the electrical component 236 may be a surface mount component, a flip-chip die, or a wire-bonding die deposed over the second substrate 202. The antenna structure 238 may be formed in the dielectric layers 206 of the second substrate 202, or may be formed in the dielectric layers 106 of the substrate 102 and over the second substrate 202. The antenna structure 238 may be micro-array antennas (patch antennas shown, but slot arrays could also be used). In one embodiment, the antenna structure 238 is configured to be operable for propagating heat, carrying electrical signals, and/or receiving a radio wave. For instance, the flip-chip 104, the second die 204, or the electrical component 236 may be operable to receive or transmit an RF or microwave or mm wave transmission from the antenna structure 238. The flip-chip 104, the second die 204, and the electrical component 236 may filter, amplify, and/or process the RF transmission, and subsequently provide an RF output to the second substrate 202.

Figure 4B:
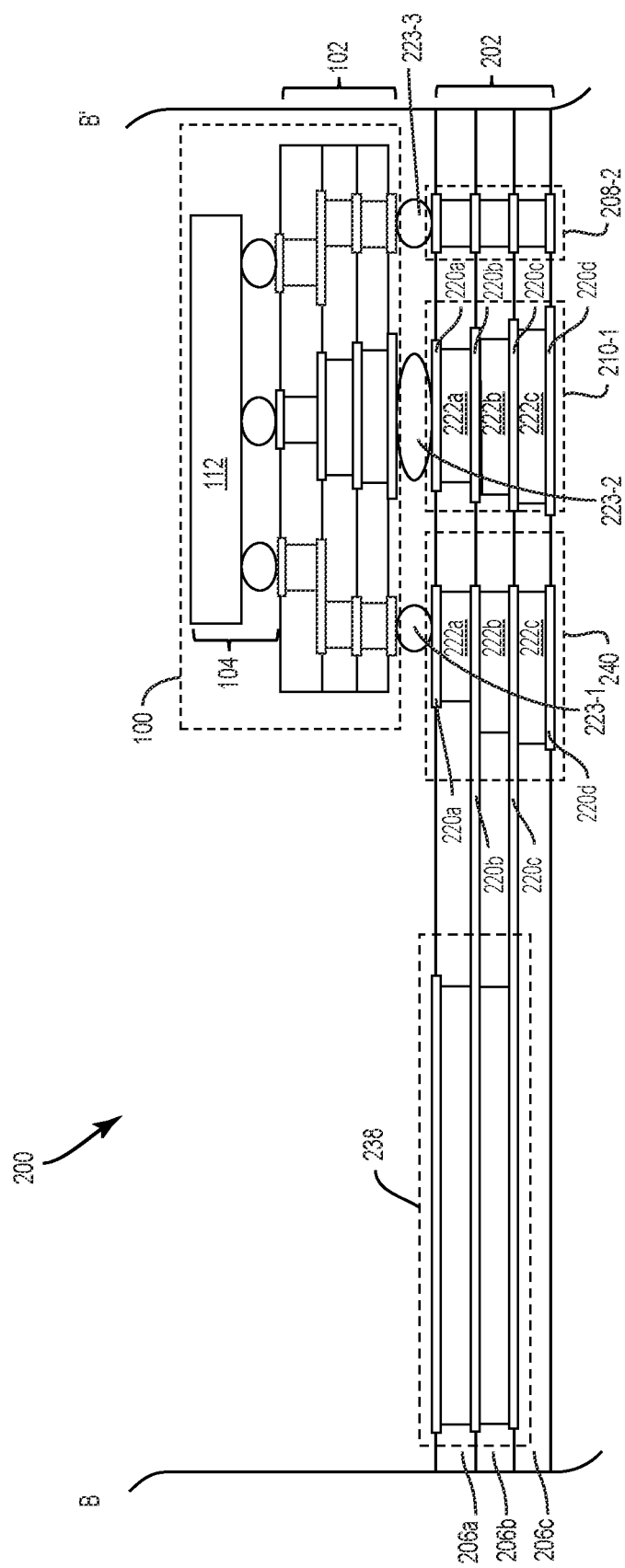
Figure 4C:
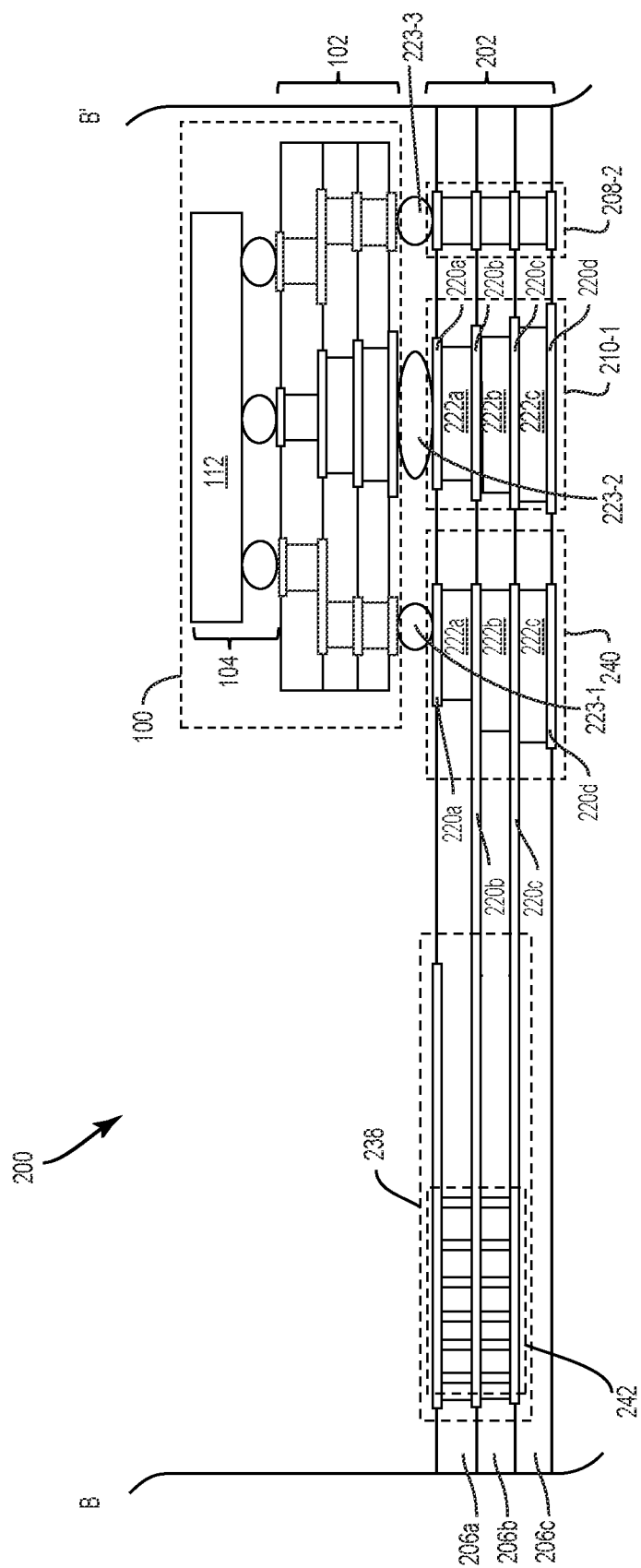
Figure 4D:
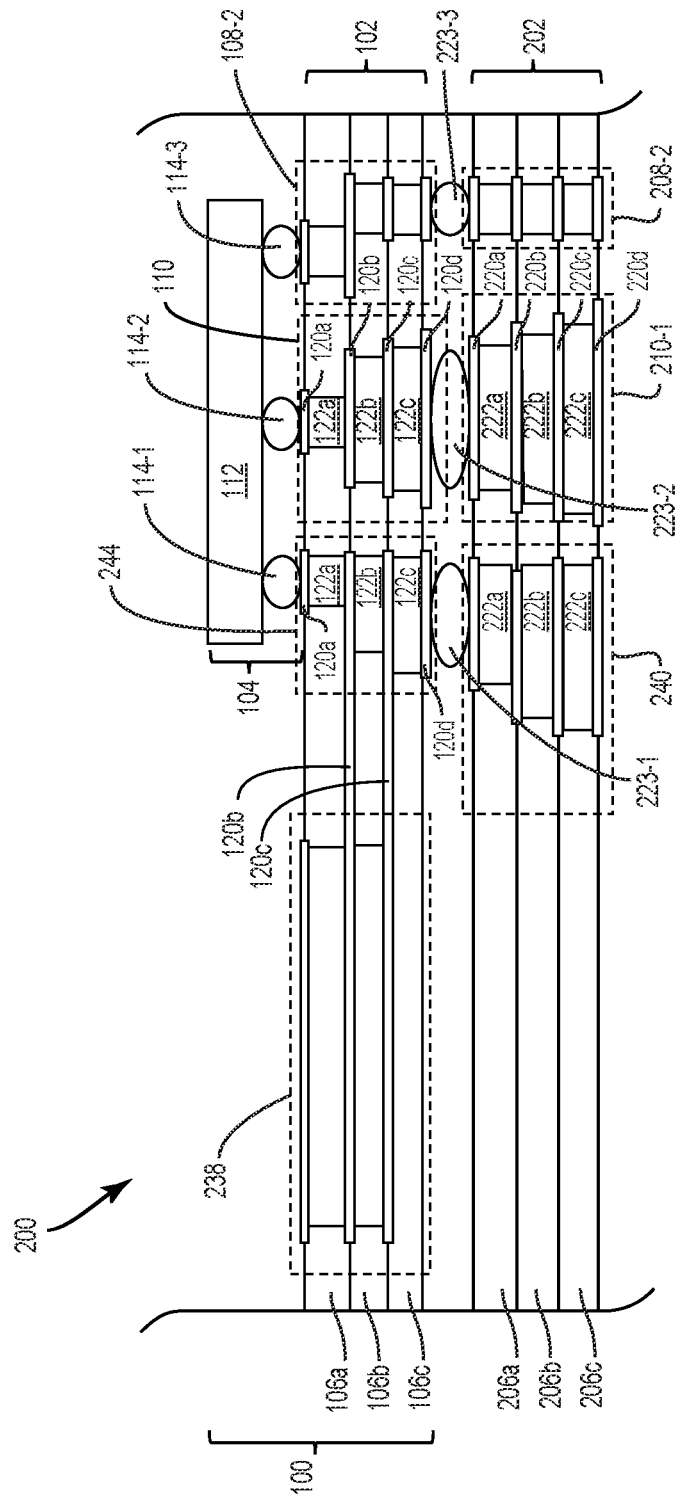

FIGS. 4B-4D show cross section views with reference to FIG. 4A. In one embodiment, the antenna structure 238 is formed within the second substrate 202, laterally offset from the chiplet 100, and configured to transmits/receive RF signals to the flip-chip die 104 in the chiplet 100, as illustrated in FIG. 4B (along the dashed line B-B'). To further improve heat dissipation performance, the first via structure 208-1 of the second substrate 202, which is connected to the first via structure 108-1 of the first substrate 202, is replaced by an extra heatsink stanchion 240. This extra heatsink stanchion 240 has a layered-cake shape and includes the four heatsink metal plates 220a~220d and three heatsink metal bars 222a-222c as the first heatsink stanchion 210-1. Herein, heat from the antenna structure 238 may propagate through the second heatsink metal plate 222b and the third heatsink metal plate 222c to the extra heatsink stanchion 240, and radiate out of the extra heatsink stanchion 240 by way of the first heatsink stanchions 210-1, for example.

FIG. 4C illustrates that the antenna structure 238 is a patch antenna structure, which includes one or more metal patches 241 (only one metal patch is shown for simplicity) and feed lines 242. The metal patches 241 may be formed by utilizing a same metal layer as the first heatsink metal plate 220a. The heat still propagate from the antenna structure 238 through the second heatsink metal plate 222b and the third heatsink metal plate 222c to radiate out of the extra heatsink stanchion 240.

In one embodiment, the antenna structure 238 is formed within the first substrate 102, laterally offset from the flip-chip die 104, and configured to transmits/receive RF signals to the flip-chip die 104, as illustrated in FIG. 4D (along the dashed line B"-B'). To further improve heat dissipation performance, the first via structure 108-1 of the first substrate 102 may be replaced by an extra heatsink stanchion 244. This extra heatsink stanchion 244 within the first substrate 102 has a layered-cake shape and includes the four heatsink metal plates 120a~120d and three heatsink metal bars 122a-122c as the heatsink stanchion 110 of the first substrate 102. The extra heatsink stanchion 244 within the first substrate 102 is connected to the extra heatsink stanchion 240 within the second substrate 202 by the first package interconnect 223-1. Therefore, heat from the antenna structure 238 may propagate through the second heatsink metal plate 122b and the third heatsink metal plate 122c to the extra heatsink stanchion 244 within the first substrate 102, then to the extra heatsink stanchion 240 within the second substrate 202, and finally radiate out of the extra heatsink stanchion 240.

Turning now to FIGS. 5A-5G, which provide exemplary steps that illustrate a process to fabricate the SIP illustrated in any of FIGS. 3A-3C. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 5A-5G.

Initially, a substrate wafer 102W including an array of substrates 102 is provided, as illustrated in FIG. 5A. Herein, each substrate 102 includes the dielectric layers 106, the heatsink stanchion(s) 110, and the optional via structure(s) 108 as illustrated in FIGS. 1A-1H. Next, at least one flip-chip die 104 is deposed over each substrate 102 to form a number of chiplets 100, as illustrated in 5B. Herein, each flip-chip die 104 includes the die body 112 and the interconnects 114 configured to electrically/thermally connect the die body 112 to the corresponding substrate 102 as illustrated in FIGS. 1A-1H (only one substrate 102, one flip-chip die 104, and one chiplet 100 are labeled with reference numbers for clarity).

FIG. 5C illustrates a singulation step to separate individual chiplets 100. Then, the chiplets 100 are deposed over a second substrate wafer 202W, as illustrated in FIG. 5D. The second substrate wafer 202W includes an array of second substrates 202, each of which includes the dielectric layers 206, the via structures 208, and the heatsink stanchions 210 as illustrated in FIGS. 3A-3C. Herein, at least one chiplet 100 is deposed over a corresponding second substrate 202 by the package interconnects 223 as illustrated in FIGS. 3A-3C. In addition, at least one second die 204 is also deposed over each second substrate 202, as illustrated in FIG. 5E. Herein, each second die 204 may be a flip-chip die that includes the die body 212 and the interconnects 214, or may be a wire-bonding die that includes the die body 212 and the bonding wires 234, as illustrated in FIGS. 3A-3C. If the second die 204 is a flip-chip die, the die body 212 connects to the second substrate 202 by the interconnects 214. If the second die 204 is a wire-bonding die, the die body 212 resides over the second substrate 202 without the interconnects 214 and is electrically connected to the second substrate 202 by the bonding wires 234 (only one chiplet 100, one second substrate 202, and one second die 204 are labeled with reference numbers for clarity). Notice that, the chiplets 100 and the second dies 204 may be deposed in a different order or at a same time.

Once the chiplets 100 and the second dies 204 are both deposed, the mold compound 224 is formed over the second substrate 202W to form a molded wafer 200W, as illustrated in FIG. 5F. The molded wafer 200W includes a number of SIPs 200, each of which includes the chiplet 100, a second die 204, a second substrate 202, and a portion of the mold compound 224 (only one chiplet 100, one second substrate 202, one second die 204, and one SIP 200 are labeled with reference number for clarity). The mold compound 224 at least partially encapsulates each chiplet 100 and each second die 204. In one embodiment, the mold compound 224 partially encapsulates each chiplet 100 and each second die 204, where the backside of each chiplet 100 and the backside of each second die 204 are exposed through the mold compound 224, as illustrated in FIG. 3A. In one embodiment, the mold compound 224 partially encapsulates each chiplet 100 and fully encapsulates each second die 204, where the backside of each chiplet 100 is exposed through the mold compound 224 and no portion of the second die 204 is exposed, as illustrated in FIG. 3C. Finally, a second singulation step is applied to the molded wafer 200W to form individual SIPs 200, as illustrated in FIG. 5G (only one SIP 200 is shown for clarity).

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a chiplet having a first die and a substrate that includes a plurality of dielectric layers, at least one heatsink stanchion, and at least one via structure, wherein:
   the at least one heatsink stanchion includes a plurality of heatsink metal plates and a plurality of heatsink metal bars, wherein the plurality of heatsink metal bars is vertically alternated with the plurality of heatsink metal plates;
   the at least one via structure includes a plurality of via metal plates and a plurality of via metal bars, wherein the plurality of via metal bars is vertically alternated with the plurality of via metal plates;
   the plurality of heatsink metal bars is configured in a layered-cake shape, such that horizontal dimensions of the plurality of heatsink metal bars increase from top to bottom;
   at least one of the plurality of heatsink metal bars vertically and completely protrudes beyond the plurality of dielectric layers, and at least another one of the plurality of heatsink metal bars extends through one of the plurality of dielectric layers, wherein each of the plurality of heatsink metal bars is formed of a metal or a metallic alloy;
   at least one of the plurality of heatsink metal bars in the at least one heatsink stanchion is more than ten times larger than one of the plurality of via metal bars in the at least one via structure in a horizontal plane; and
   the first die is deposed over the substrate and connected to the at least one heatsink stanchion and the at least one via structure, such that heat generated by the first die is eligible to be dissipated by the at least one heatsink stanchion within the substrate, and signals are eligible to be transmitted to and received from the first die through the at least one via structure.

2. The apparatus of claim 1 wherein each of the plurality of heatsink metal bars is shaped like a cube, a cylinder, a triangular prism, or a trapezoidal prism.

3. The apparatus of claim 1 wherein at least one of the plurality of heatsink metal bars is capable of being sized as large as about 95% of a horizontal area of the chiplet.

4. The apparatus of claim 1 wherein the first die is a flip-chip die, which includes a die body and a plurality of interconnects configured to connect the die body and the substrate, wherein at least one of the plurality of interconnects is configured to connect the die body and the at least one heatsink stanchion within the substrate.

5. The apparatus of claim 4 wherein:
   the die body includes one or more materials of silicon (Si), Gallium Arsenide (GaAs), GaAs on Si, Gallium Nitride (GaN), GaN on Si, GaN on Silicon Carbide (SiC), and piezoelectric materials; and
   the plurality of interconnects consists of solder bumps or copper (Cu) pillars.

6. The apparatus of claim 4 wherein:
   the plurality of dielectric layers includes at least a top dielectric layer and a bottom dielectric layer underneath the top dielectric layer;
   the plurality of heatsink metal plates includes at least a top heatsink metal plate and a bottom heatsink metal plate, and the plurality of heatsink metal bars includes at least a top heatsink metal bar underneath the top heatsink metal plate and a bottom heatsink metal bar underneath the top heatsink metal bar; and
   the at least one of the plurality of interconnects is connected to the at least one heatsink stanchion by directly contacting the top heatsink metal plate.

7. The apparatus of claim 6 wherein:
the plurality of heatsink metal plates further includes a middle heatsink metal plate underneath the top heatsink metal bar, which is formed at a top of the top dielectric layer;
the top heatsink metal bar protrudes vertically beyond the top of the top dielectric layer and connects the middle heatsink metal plate and the top heatsink metal plate; and
the bottom heatsink metal plate is formed at a bottom of the bottom dielectric layer, and the bottom heatsink metal bar is connected to the bottom heatsink metal plate and extends through the bottom dielectric layer.

8. The apparatus of claim 6 wherein:
the top heatsink metal plate is formed at a top of the top dielectric layer, and the top heatsink metal bar is connected to the top heatsink metal plate and extends through the top dielectric layer; and
the bottom heatsink metal plate is formed at a bottom of the bottom dielectric layer, and the bottom heatsink metal bar is connected to the bottom heatsink metal plate and protrudes vertically beyond the bottom of the bottom dielectric layer.

9. The apparatus of claim 1 wherein the chiplet further includes an enclosure residing over the substrate to at least partially encapsulate the first die.

10. The apparatus of claim 9 wherein the enclosure is a mold compound.

11. The apparatus of claim 9 wherein the enclosure includes a cap and an outer wall that extends from the cap toward a top surface of the substrate to form an air cavity, wherein the first die resides within the air cavity.

12. The apparatus of claim 1 wherein the substrate further comprises an antenna structure residing in the plurality of dielectric layers of the substrate, wherein the antenna structure is laterally offset from the first die and configured to transmit/receive signals to/from the first die.

13. An apparatus comprising:
a chiplet having a first die and a substrate that includes a plurality of dielectric layers, at least one heatsink stanchion, and at least one via structure, wherein:
the at least one heatsink stanchion includes a plurality of heatsink metal plates and a plurality of heatsink metal bars, wherein plurality of heatsink metal bars is vertically alternated with the plurality of heatsink metal plates;
the at least one via structure includes a plurality of via metal plates and a plurality of via metal bars, wherein the plurality of via metal bars is vertically alternated with the plurality of via metal plates;
the plurality of heatsink metal bars is configured in a layered-cake shape, such that horizontal dimensions of the plurality of heatsink metal bars increase from top to bottom;
the first die is deposed over the substrate and connected to the at least one heatsink stanchion and the at least one via structure, such that heat generated by the first die is eligible to be dissipated by the at least one heatsink stanchion within the substrate, and signals are eligible to be transmitted to and received from the first die through the at least one via structure; and
one of the plurality of via metal bars is located beyond horizontal dimensions of the first die and protrudes vertically above the plurality of dielectric layers to form a grounded metal wall.

14. The apparatus of claim 13 wherein the grounded metal wall is configured as a continuous circular.

15. The apparatus of claim 13 wherein the grounded metal wall is configured as several straight strips or several curved strips.

16. The apparatus of claim 13 wherein each of the plurality of heatsink metal bars is shaped like a cube, a cylinder, a triangular prism, or a trapezoidal prism.

17. The apparatus of claim 13 wherein:
the first die is a flip-chip die, which includes a die body and a plurality of interconnects configured to connect the die body and the substrate, wherein at least one of the plurality of interconnects is configured to connect the die body and the at least one heatsink stanchion within the substrate;
the die body includes one or more materials of silicon (Si), Gallium Arsenide (GaAs), GaAs on Si, Gallium Nitride (GaN), GaN on Si, GaN on Silicon Carbide (SiC), and piezoelectric materials; and
the plurality of interconnects consists of solder bumps or copper (Cu) pillars.

18. The apparatus of claim 13 wherein:
the substrate further comprises an antenna structure residing in the plurality of dielectric layers of the substrate, and the antenna structure is laterally offset from the first die and configured to transmit/receive signals to/from the first die; and
the antenna structure is connected to the at least one heatsink stanchion, such that heat generated by the antenna structure can be dissipated by the at least one heatsink stanchion within the substrate.

19. An apparatus comprising:
a chiplet having a first die and a substrate that includes a plurality of dielectric layers, a first heatsink stanchion, a second heatsink stanchion,
and an opening extending vertically through the plurality of dielectric layers and separating the first heatsink stanchion and the second heatsink stanchion, wherein:
each of the first heatsink stanchion and the second heatsink stanchion includes a plurality of heatsink metal plates and a plurality of heatsink metal bars, wherein the plurality of heatsink metal bars is vertically alternated with the plurality of heatsink metal plates;
the plurality of heatsink metal bars is configured in a layered-cake shape, such that horizontal dimensions of the plurality of heatsink metal bars increase from top to bottom; and
the first die is deposed over the substrate, straddles the opening, and is connected to the first heatsink stanchion and the second heatsink stanchion, wherein the first heatsink stanchion and the second heatsink stanchion are configured to dissipate heat generated by the first die and configured to transmit signals to or receive signals from the first die.

20. The apparatus of claim 12 wherein the antenna structure is connected to the at least one heatsink stanchion, such that heat generated by the antenna structure can be dissipated by the at least one heatsink stanchion within the substrate.

21. The apparatus of claim 12 wherein the antenna structure comprises micro-array antennas.

22. The apparatus of claim 19 wherein each of the plurality of heatsink metal bars is shaped like a cube, a cylinder, a triangular prism, or a trapezoidal prism.

23. The apparatus of claim 19 wherein:
the first die is a flip-chip die, which includes a die body and a plurality of interconnects configured to connect the die body and the substrate, wherein one of the plurality of interconnects is configured to connect the die body and the first heatsink stanchion within the substrate, and another one of the plurality of interconnects is configured to connect the die body and the second heatsink stanchion within the substrate;

the die body includes one or more materials of silicon (Si), Gallium Arsenide (GaAs), GaAs on Si, Gallium Nitride (GaN), GaN on Si, GaN on Silicon Carbide (SiC), and piezoelectric materials; and the plurality of interconnects consists of solder bumps or copper (Cu) pillars.

24. The apparatus of claim 19 wherein:

the substrate further comprises an antenna structure residing in the plurality of dielectric layers of the substrate, and the antenna structure is laterally offset from the first die and configured to transmit/receive signals to/from the first die; and the antenna structure is connected to one of the first heatsink stanchion and the second heatsink stanchion, such that heat generated by the antenna structure can be dissipated by the first heatsink stanchion or the second heatsink stanchion.

\* \* \* \* \*